United States Patent
Choi et al.

(10) Patent No.: US 9,382,621 B2
(45) Date of Patent: Jul. 5, 2016

(54) GROUND RETURN FOR PLASMA PROCESSES

(75) Inventors: Soo Young Choi, Fremont, CA (US); Robin L. Tiner, Santa Cruz, CA (US); Shinichi Kurita, San Jose, CA (US); John M. White, Hayward, CA (US); Carl A. Sorensen, Morgan Hill, CA (US); Jeffrey A. Kho, Union City, CA (US); Suhail Anwar, San Jose, CA (US); Makoto Inagawa, Palo Alto, CA (US); Gaku Furuta, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 891 days.

(21) Appl. No.: 12/700,484

(22) Filed: Feb. 4, 2010

(65) Prior Publication Data

US 2010/0196626 A1    Aug. 5, 2010

Related U.S. Application Data

(60) Provisional application No. 61/149,990, filed on Feb. 4, 2009, provisional application No. 61/167,681, filed on Apr. 8, 2009, provisional application No. 61/264,576, filed on Nov. 25, 2009, provisional application No. 61/293,549, filed on Jan. 8, 2010.

(51) Int. Cl.
   *C23C 16/509*    (2006.01)
   *C23C 16/458*    (2006.01)
   (Continued)

(52) U.S. Cl.
   CPC ......... *C23C 16/4585* (2013.01); *C23C 16/5096* (2013.01); *H01J 37/32091* (2013.01); *H01J 37/32174* (2013.01); *H01J 37/32568* (2013.01); *H01L 21/67069* (2013.01)

(58) Field of Classification Search
   CPC ............ C23C 16/4585; C23C 16/5096; H01L 21/67069; H01J 37/32174; H01J 37/32568; H01J 37/32091
   See application file for complete search history.

(56) References Cited

U.S. PATENT DOCUMENTS 4,389,135 A * 6/1983 Peters .......................... 403/327
4,998,178 A   3/1991 Weiss
(Continued)

FOREIGN PATENT DOCUMENTS

JP    H03-138372 A    6/1991
JP    03182070 A *    8/1991
(Continued)

OTHER PUBLICATIONS

"Hastelloy C-276". Megamex. 2004.*
(Continued)

*Primary Examiner* — Jeffrie R Lund
*Assistant Examiner* — Yuechuan Yu
(74) *Attorney, Agent, or Firm* — Patterson & Sheridan, LLP

(57) ABSTRACT

A method and apparatus for providing an electrically symmetrical ground or return path for electrical current between two electrodes is described. The apparatus includes at least on radio frequency (RF) device coupled to one of the electrodes and between a sidewall and/or a bottom of a processing chamber. The method includes moving one electrode relative to another and realizing a ground return path based on the position of the displaced electrode using one or both of a RF device coupled to a sidewall and the electrode, a RF device coupled to a bottom of the chamber and the electrode, or a combination thereof.

33 Claims, 28 Drawing Sheets

(51) Int. Cl.
*H01J 37/32* (2006.01)
*H01L 21/67* (2006.01)

(56) References Cited

U.S. PATENT DOCUMENTS

| | | | |
|---|---|---|---|
| 5,063,861 A * | 11/1991 | Imogawa et al. | 110/336 |
| 5,522,937 A | 6/1996 | Chew et al. | |
| 5,964,947 A | 10/1999 | Zhao et al. | |
| 6,024,044 A | 2/2000 | Law et al. | |
| 6,063,441 A | 5/2000 | Koai et al. | |
| 6,162,332 A | 12/2000 | Chiu | |
| 6,183,564 B1 | 2/2001 | Reynolds et al. | |
| 6,221,221 B1 * | 4/2001 | Al-Shaikh et al. | 204/298.02 |
| 6,228,229 B1 | 5/2001 | Raaijmakers et al. | |
| 6,264,812 B1 | 7/2001 | Raaijmakers et al. | |
| 6,270,859 B2 | 8/2001 | Zhao et al. | |
| 6,297,595 B1 | 10/2001 | Stimson et al. | |
| 6,700,089 B1 | 3/2004 | Hirooka | |
| 6,726,805 B2 | 4/2004 | Brown et al. | |
| 6,773,562 B1 | 8/2004 | Inagawa et al. | |
| 6,830,624 B2 | 12/2004 | Janakiraman et al. | |
| 6,857,387 B1 | 2/2005 | Sun et al. | |
| 6,933,442 B2 | 8/2005 | Franks, Jr. | |
| 7,060,545 B1 | 6/2006 | Husher | |
| 7,083,702 B2 | 8/2006 | Blonigan et al. | |
| 7,100,532 B2 | 9/2006 | Pribyl | |
| 7,112,536 B2 | 9/2006 | Markunas et al. | |
| 7,375,946 B2 | 5/2008 | White et al. | |
| 7,534,301 B2 | 5/2009 | White et al. | |
| 2001/0035132 A1 * | 11/2001 | Kent et al. | 118/733 |
| 2004/0226514 A1 * | 11/2004 | Mahon et al. | 118/728 |
| 2004/0250955 A1 * | 12/2004 | Blonigan et al. | 156/345.51 |
| 2005/0056370 A1 | 3/2005 | Brown et al. | |
| 2005/0095732 A1 | 5/2005 | Maebashi et al. | |
| 2005/0255257 A1 | 11/2005 | Choi et al. | |
| 2006/0060138 A1 | 3/2006 | Keller et al. | |
| 2006/0060302 A1 * | 3/2006 | White et al. | 156/345.28 |
| 2006/0162657 A1 * | 7/2006 | Cirigliano | 118/715 |
| 2009/0242383 A1 * | 10/2009 | Vukovic et al. | 204/164 |

FOREIGN PATENT DOCUMENTS

| | | |
|---|---|---|
| JP | H03-240952 A | 10/1991 |
| JP | H08-186101 A | 7/1996 |
| JP | 10079350 A * | 3/1998 |
| JP | H10-280142 A | 10/1998 |
| JP | 2003077848 A * | 3/2003 |
| JP | 2005-123578 A | 5/2005 |
| JP | 2007-180596 | 7/2007 |
| KR | 10-1998-0070700 | 10/1998 |
| KR | 10-2002-0013844 | 2/2002 |
| SU | 1001250 A * | 2/1983 |

OTHER PUBLICATIONS

PCT International Search Report and Written Opinion dated Sep. 29, 2010 for International Application No. PCT/US2010/023236.
Chinese Office Action Application No. 201080007090.7 dated Sep. 29, 2013.
Chen, Guobang, "Low-temperature Engineering Materials", Zheijian University Presss, Feb. 28, 1998, p. 79.
Qiu, Zhuxian, Aluminum-electrolyzing Principles and Applications, China Mining University Press, Jul. 31, 1998, pp. 24-25.
PTA, Hastelloy-C-276, Mar. 31, 1998, pp. 31-32.
Chinese Office Action dated May 16, 2014.
Japanese Office Action dated Feb. 18, 2014 for Application No. 2011-548432.
Chinese Office Action (with attached English translation) for Application No. 201080007090.7 dated Oct. 31, 2014; 13 total pages.

* cited by examiner

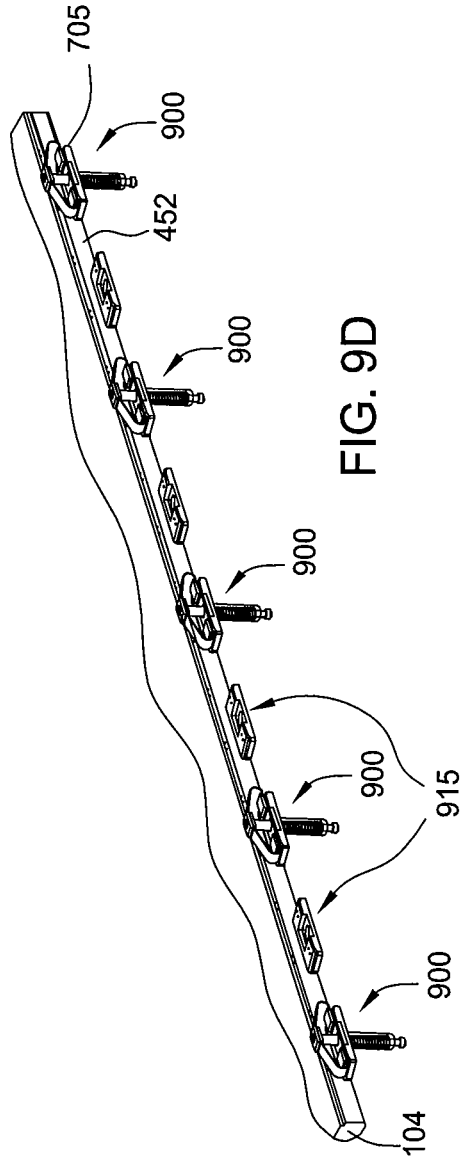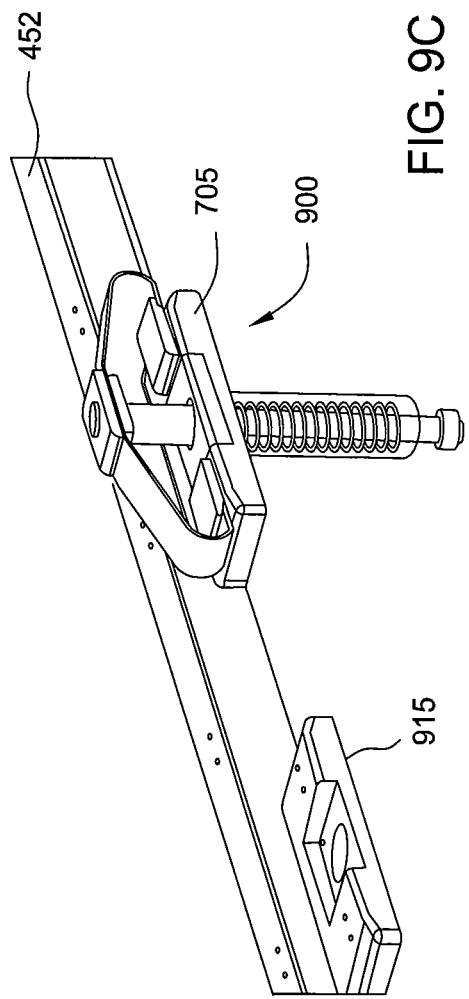

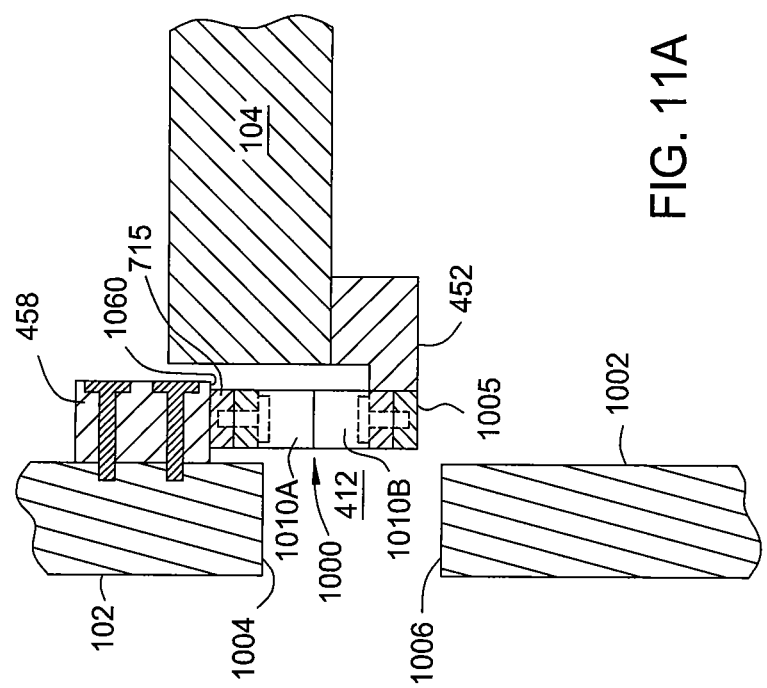

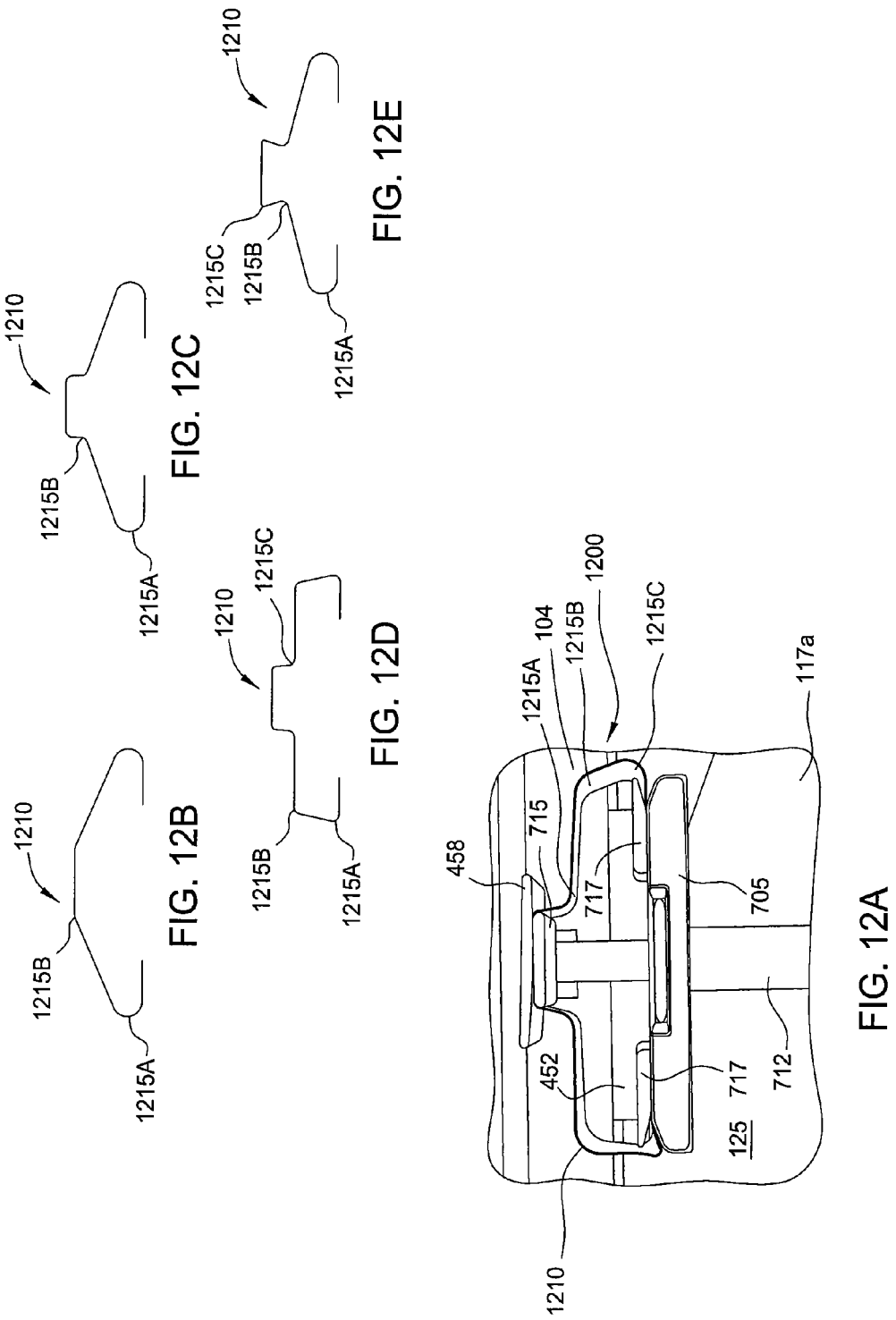

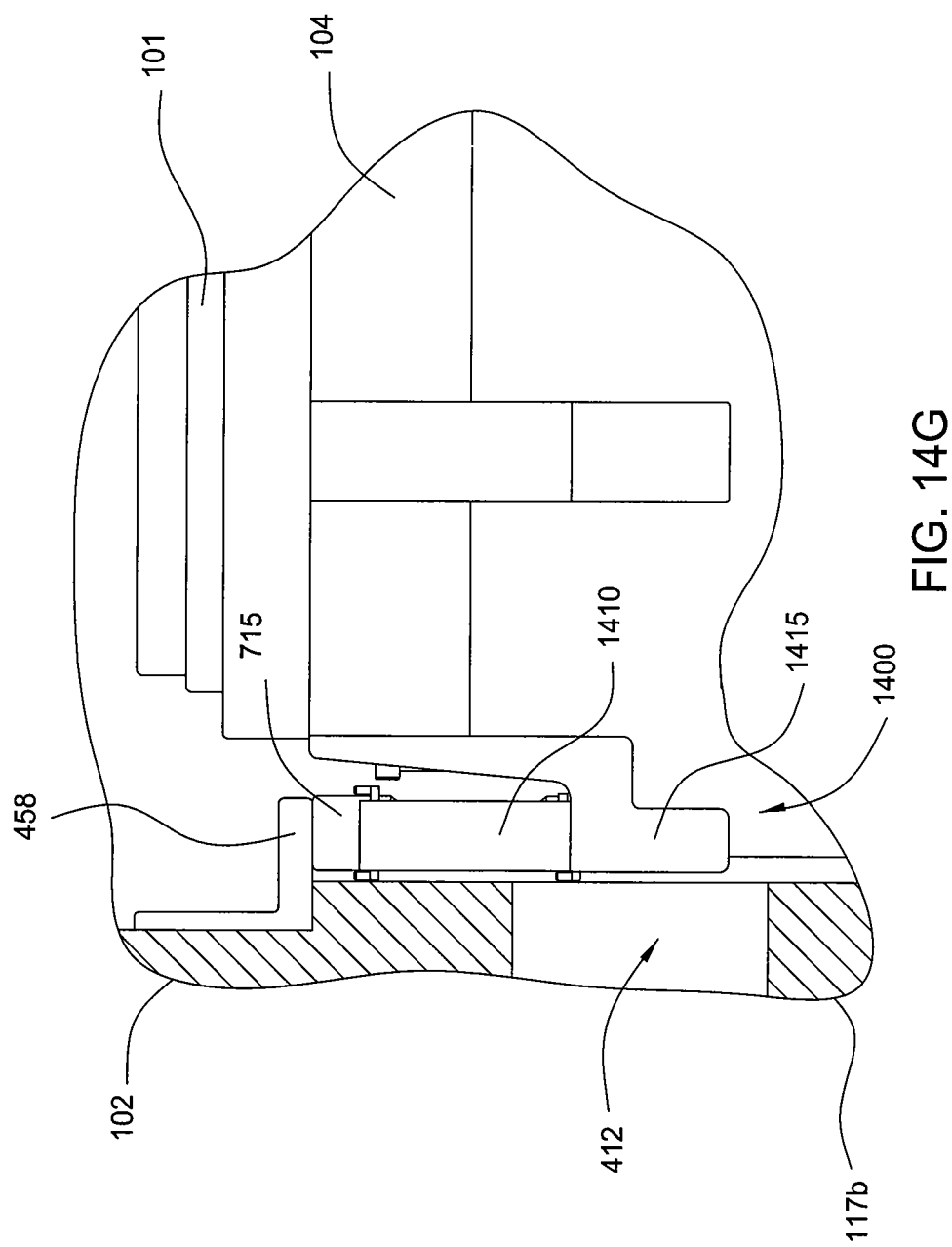

GROUND RETURN FOR PLASMA PROCESSES

CROSS-REFERENCE TO RELATED APPLICATIONS

This application claims benefit of U.S. Provisional Patent Application Ser. No. 61/149,990, filed Feb. 4, 2009, U.S. Provisional Patent Application Ser. No. 61/167,681, filed Apr. 8, 2009, U.S. Provisional Patent Application Ser. No. 61/264, 576, filed Nov. 25, 2009 and U.S. Provisional Patent Application Ser. No. 61/293,549, filed Jan. 8, 2010. All of the aforementioned patent applications are hereby incorporated by reference.

BACKGROUND OF THE INVENTION

1. Field of the Invention

Embodiments of the present invention generally relate to a method and apparatus for processing substrates, such as solar panel substrates, flat panel substrates, or semiconductor substrates, using plasma. More particularly, embodiments of the present invention relate to a radio frequency (RF) current return path for a plasma processing chamber.

2. Description of the Related Art

Plasma enhanced chemical vapor deposition (PECVD) is generally employed to deposit thin films on substrates, such as semiconductor substrates, solar panel substrates, and liquid crystal display (LCD) substrates. PECVD is generally accomplished by introducing a precursor gas into a vacuum chamber having a substrate disposed on a substrate support. The precursor gas is typically directed through a gas distribution plate situated near the top of the vacuum chamber. The precursor gas in the vacuum chamber is energized (e.g., excited) into a plasma by applying a radio frequency (RF) power to the chamber from one or more RF sources coupled to the chamber. The excited gas reacts to form a layer of material on a surface of a substrate that is positioned on a temperature controlled substrate support. The distribution plate is generally connected to a RF power source and the substrate support is typically connected to the chamber body providing a RF current return path.

Uniformity is generally desired in the thin films deposited using PECVD processes. For example, an amorphous silicon film, such as microcrystalline silicon film, or a polycrystalline silicon film is usually deposited using PECVD on a flat panel for forming p-n junctions required in transistors or solar cells. The quality and uniformity of the amorphous silicon film or polycrystalline silicon film are important for commercial operation. Therefore, there is a need for PECVD chambers with improved plasma and deposition uniformity.

As the demand for larger LCD's and solar panels continues to grow, so does the size of the substrate that is used to make the LCD's and solar panels. The size of the substrates now routinely exceeds 1 square meter in area. When compared to the size of semiconductor substrates, which typically are about 300 millimeters in diameter, it can be easily understood that a chamber sized to process a semiconductor wafer may not be sufficiently large to process a substrate of 1 square meter or larger. Thus, larger area processing chambers need to be developed.

These large area processing chambers may, in some cases, be identical to the semiconductor counterpart chambers where simply scaling up in size achieves acceptable results. In other cases, scaling up the size of the processing chamber is not effective, as unforeseen difficulties occur when scaling up the processing chambers. Designing large chambers for application of RF energy is one example where scaling does not produce satisfactory results.

Additionally, the process conditions for processes that are performed in the large area processing chambers may need to be adjusted. Determining proper gas flows, timing sequences, RF power application, temperature conditions, and other process variables may require a significant amount of research and experimentation that is far beyond routine.

Therefore, care needs to be taken to design a chamber that can process large area substrates.

SUMMARY OF THE INVENTION

Embodiments of the present invention generally relate to a method and apparatus for plasma processing a substrate. More particularly, embodiments of the present invention provide a plasma processing chamber having one or more radio frequency (RF) grounding or return devices adapted to provide an advantageous RF return path.

In one embodiment, a radio frequency return device for a plasma processing chamber is described. The return device includes a base having a shaft movably disposed within an opening formed in the base, a spring coupled between the base and the shaft, the spring comprising a first material made of a metal or metal alloy having an elastic property that is substantially the same at an ambient temperature and a processing temperature of about 200° C. or greater, and a second material substantially encasing the first material, the second material being different than the first material.

In another embodiment, a plasma processing system is described. The plasma processing system includes a chamber, and at least one electrode disposed within the chamber, the at least one electrode facilitating generation of a plasma within the chamber and movable relative to a second electrode within the chamber, the at least one electrode being maintained electrically coupled while moving relative to the second electrode by one or more flexible contact members, at least one of the one or more flexible contact members comprising a material made of a metal or metal alloy that substantially retains elasticity without plastically deforming when the material reaches a temperature above about 200° C.

In another embodiment, a method is described. The method includes moving a first electrode in a chamber relative to a second electrode, applying radio frequency power between the first electrode and the second electrode, and establishing a selective electrical connection between the first electrode and a grounded component of the chamber based on a distance between the first electrode and the second electrode.

In another embodiment, a method is described. The method includes applying a radio frequency power between the movable electrode and a fixed electrode disposed in a chamber, providing a first radio frequency return path to a bottom of the chamber, displacing the movable electrode relative to the fixed electrode, and providing a second radio frequency return path to a sidewall of the chamber through one or more compressible contact members.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 9C and 9D are isometric views of one embodiment of a bracket.

FIGS. 11A and 11B are side cross-sectional views of a portion of the chamber body showing the compressible contact member of FIG. 10A.

FIG. 12A is an isometric side view of another embodiment of a compressible contact member.

FIGS. 12B-12E are side views of various embodiments of a spring form that may be utilized with the contact member shown in FIG. 12A.

FIG. 14G is a side cross-sectional view of a contact member as described in FIGS. 14A and 14B coupled to a substrate support in a raised position.

Figure 1A:
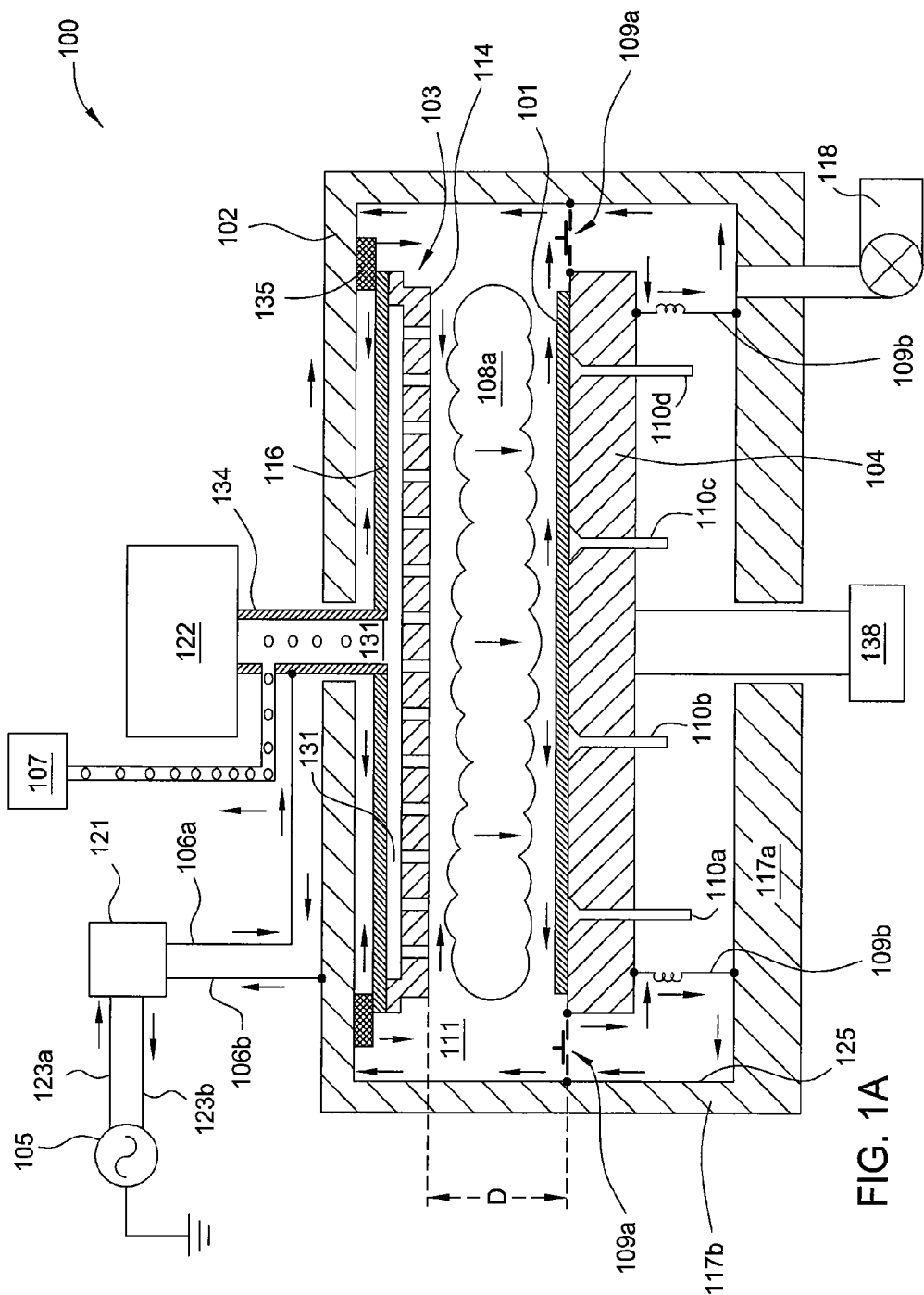
FIG. 1A is a schematic cross-sectional view of one embodiment of a plasma processing system.

To facilitate understanding, identical reference numerals have been used, wherever possible, to designate identical elements that are common to the figures. It is contemplated that elements and/or process steps of one embodiment may be beneficially incorporated in other embodiments without additional recitation.

DETAILED DESCRIPTION

Embodiments of the present invention generally relate to a method and apparatus for processing substrates using plasma and/or cleaning components using plasma. Embodiments described herein relate to methods of enhancing plasma formation and depositing materials onto a substrate by providing an improved ground or return path for electrical current. In the description that follows, reference will be made to a plasma enhanced chemical vapor deposition (PECVD) chamber, but it is to be understood that the embodiments herein may be practiced in other chambers as well, including physical vapor deposition (PVD) chambers, etching chambers, semiconductor processing chambers, solar cell processing chambers, and organic light emitting display (OLED) processing chambers to name only a few. Suitable chambers that may be used are available from AKT America, Inc., a subsidiary of Applied Materials, Inc., Santa Clara, Calif. It is to be understood that the embodiments discussed herein may be practiced in chambers available from other manufacturers as well.

Embodiments of the present invention are generally utilized in processing rectangular substrates, such as substrates for liquid crystal displays or flat panels, and substrates for solar panels. Other suitable substrates may be circular, such as semiconductor substrates. The chambers used for processing substrates typically include a substrate transfer port formed in a sidewall of the chamber for transfer of the substrate. The transfer port generally includes a length that is slightly greater than one or more major dimensions of the substrate. The transfer port may produce challenges in RF return schemes. The present invention may be utilized for processing substrates of any size or shape. However, the present invention provides particular advantage in substrates having a plan surface area of about 15,600 $cm^2$ and including substrates having a plan surface area of about a 90,000 $cm^2$ surface area (or greater). The increased size of the substrate surface area presents challenges in uniform processing due to the increased difficulty in providing a suitable ground path, particularly at or near the transfer port. Embodiments described herein provide a solution to these challenges during processing of the larger substrate sizes.

FIG. 1A is a schematic cross-sectional view of one embodiment of a plasma processing system 100. The plasma processing system 100 is configured to process a large area substrate 101 using plasma in forming structures and devices on the large area substrate 101 for use in the fabrication of liquid crystal displays (LCD's), flat panel displays, organic light emitting diodes (OLED's), or photovoltaic cells for solar cell arrays. The substrate 101 may be thin sheet of metal, plastic, organic material, silicon, glass, quartz, or polymer, among others suitable materials. The substrate 101 may have a surface area greater than about 1 square meter, such as greater than about 2 square meters. In other embodiments, the substrate 101 may include a plan surface area of about 15,600 $cm^2$, or greater, for example about a 90,000 $cm^2$ plan surface area (or greater). The structures may be thin film transistors which may comprise a plurality of sequential deposition and masking steps. Other structures may include p-n junctions to form diodes for photovoltaic cells.

The plasma processing system 100 may be configured to deposit a variety of materials on the large area substrates 101, including but not limited to dielectric materials (e.g., $SiO_2$, $SiO_xN_y$, derivatives thereof or combinations thereof), semiconductive materials (e.g., Si and dopants thereof), barrier materials (e.g., $SiN_x$, $SiO_xN_y$, or derivatives thereof). Specific examples of dielectric materials and semiconductive materials that are formed or deposited by the plasma processing system 100 onto the large area substrates may include epitaxial silicon, polycrystalline silicon, amorphous silicon, microcrystalline silicon, silicon germanium, germanium, silicon dioxide, silicon oxynitride, silicon nitride, dopants thereof (e.g., B, P, or As), derivatives thereof or combinations thereof. The plasma processing system 100 is also configured to receive gases such as argon, hydrogen, nitrogen, helium, or combinations thereof, for use as a purge gas or a carrier gas (e.g., Ar, $H_2$, $N_2$, He, derivatives thereof, or combinations thereof). One example of depositing silicon thin films on the large area substrate 101 using the system 100 may be accomplished by using silane as a processing gas in a hydrogen carrier gas.

Figure 1B:
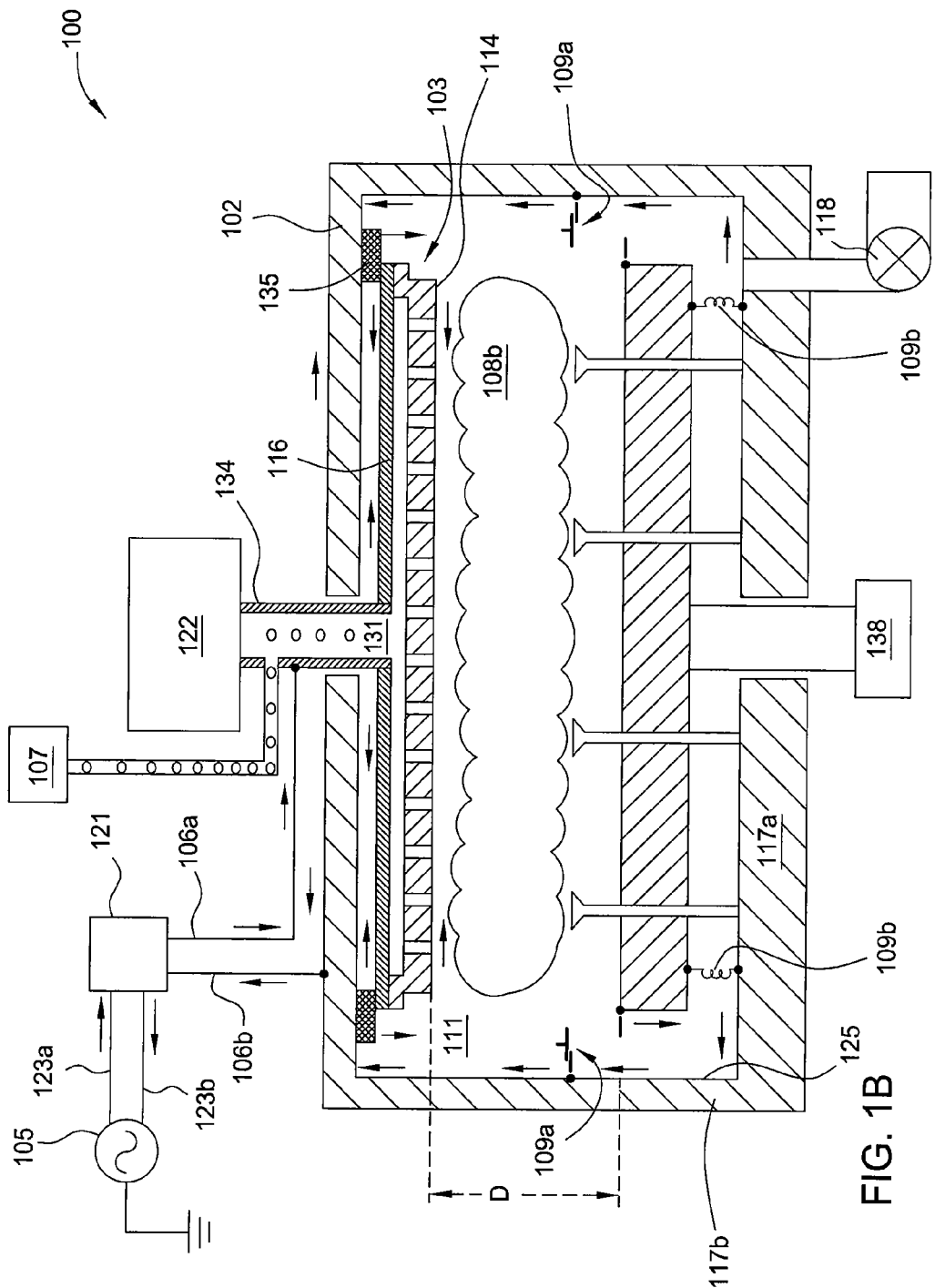
FIG. 1B is a schematic cross-sectional view of another embodiment of the plasma processing system shown in FIG. 1A.

As shown in FIG. 1A, the plasma processing system 100 generally comprises a chamber body 102 including a bottom 117a and sidewalls 117b that at least partially defines a processing volume 111. A substrate support 104 is disposed in the processing volume 111. The substrate support 104 is adapted to support the substrate 101 on a top surface during processing. The substrate support 104 is coupled to an actuator 138 adapted to move the substrate support at least vertically to facilitate transfer of the substrate 101 and/or adjust a distance D between the substrate 101 and a showerhead assembly 103. One or more lift pins 110a-110d may extend through the substrate support 104. The lift pins 110a-110d are adapted to contact the bottom 117a of the chamber body 102 and support the substrate 101 when the substrate support 104 is lowered by the actuator 138 in order to facilitate transfer of the substrate 101, as shown in FIG. 1B. In a processing position as shown in FIG. 1A, the lift pins 110a-110d are adapted to be flush with or slightly below the upper surface of the substrate support 104 to allow the substrate 101 to lie flat on the substrate support 104.

The showerhead assembly 103 is configured to supply a processing gas to the processing volume 111 from a processing gas source 122. The plasma processing system 100 also comprises an exhaust system 118 configured to apply negative pressure to the processing volume 111. The showerhead assembly 103 is generally disposed opposing the substrate support 104 in a substantially parallel relationship.

In one embodiment, the showerhead assembly 103 comprises a gas distribution plate 114 and a backing plate 116. The backing plate 116 may function as a blocker plate to enable formation of a gas volume 131 between the gas distribution plate 114 and the backing plate 116. The gas source 122 is connected to the gas distribution plate 114 by a conduit 134. In one embodiment, a remote plasma source 107 is coupled to the conduit 134 for supplying a plasma of activated gas through the gas distribution plate 114 to the processing volume 111. The plasma from the remote plasma source 107 may include activated gases for cleaning chamber components disposed in the processing volume 111. In one embodiment, activated cleaning gases are flowed to the processing volume 111. Suitable gases for cleaning include fluorine ($F_2$), nitrogen trifluoride ($NF_3$), sulfur hexafluoride ($SF_6$) and carbon/fluorine containing gases, such as fluorocarbons, for example octofluorotetrahydrofuran ($C_4F_8O$), carbonyl fluoride ($COF_2$), hexafluoroethane ($C_2F_6$), tetrafluoromethane ($CF_4$), perfluoropropane ($C_3F_8$), and combinations thereof. Although carbon and oxygen containing gases may be used, the gases are not favorable due to possible carbon and/or oxygen contamination.

The gas distribution plate 114, the backing plate 116, and the conduit 134 are generally formed from electrically conductive materials and are in electrical communication with one another. The chamber body 102 is also formed from an electrically conductive material. The chamber body 102 is generally electrically insulated from the showerhead assembly 103. In one embodiment, the showerhead assembly 103 is mounted on the chamber body 102 by an insulator 135.

In one embodiment, the substrate support 104 is also electrically conductive, and the substrate support 104 and the showerhead assembly 103 are configured to be opposing electrodes for generating a plasma 108a of processing gases therebetween during processing and/or a pre-treatment or post-treatment process. Additionally, the substrate support 104 and the showerhead assembly 103 may be utilized to support a plasma 108b (FIG. 1B) of cleaning gases during a cleaning process.

A radio frequency (RF) power source 105 is generally used to generate the plasma 108a between the showerhead assembly 103 and the substrate support 104 before, during and after processing, and may also be used to maintain energized species or further excite cleaning gases supplied from the remote plasma source 107. In one embodiment, the RF power source 105 is coupled to the showerhead assembly 103 by a first output 106a of an impedance matching circuit 121. A second output 106b of the impedance matching circuit 121 is electrically connected to the chamber body 102.

In one embodiment, the plasma processing system 100 includes a plurality of first RF devices 109a and a plurality of second RF devices 109b. Each of the first RF devices 109a and second RF devices 109b are coupled between the substrate support 104 and a grounded component of the chamber body 102. In one embodiment, the plurality of RF devices 109a and 109b are configured to control the return path for returning RF current during processing and/or a chamber cleaning procedure. Each of the first RF devices 109a and the second RF devices 109b may be selectively activated to be open or closed to electrical current. Each of the plurality of RF devices 109a and 109b may be spring forms, straps, wires, or cables adapted to provide a RF conductive medium between the substrate support 104 and a grounded component of the chamber body 102. In one embodiment, the RF devices 109a and 109b are configured as straps made of, or coated with, a flexible conductive material. In one aspect, the RF devices 109a and 109b are configured as straps, with the RF devices 109a having a shorter length than the RF devices 109b to facilitate a shorter path for electrical current.

In one embodiment, the RF devices 109a, 109b may be configured to make an RF return path open to (i.e., prevent the flow of) RF current. In this embodiment, the RF devices 109a and 109b may be configured as a switch. In one aspect, the open/closed characteristic of each of the RF devices 109a, 109b may be controlled by the elevation of the substrate support relative to the showerhead assembly 103. In some embodiments, the current is prevented from flowing through a predetermined one of the RF devices 109a, 109b by the elevation of the substrate support, either by triggering a switch or electrically disconnecting the selected RF device from another portion of the RF return path. In one example, the selected RF device may be electrically disconnected from a grounded component of the chamber body 102 (i.e., a component of the chamber body 102 that is in electrical communication with the RF power source 105). In one embodiment, the plurality of RF devices 109a and 109b are utilized as RF ground return devices. However, one or more of the plurality of RF devices 109a, 109b may be used for other electrical connections to apply or carry electrical current within the plasma processing system 100.

During processing, one or more processing gas is flowed to the processing volume 111 from the gas source 122 through the showerhead assembly 103. A RF power is applied between the showerhead assembly 103 and the substrate support 104 to generate a plasma 108a from the processing gases for processing the substrate 101. Uniformity of plasma distribution is generally desired during processing, although tuning of the plasma uniformity may also be useful. However, the distribution of the plasma 108a is determined by a variety of factors, such as distribution of the processing gas, geometry of the processing volume 111, the distance D between the showerhead assembly 103 and the substrate support 104, variations between deposition processes on the same substrate or different substrates, deposition processes and cleaning process, and electrical properties of the RF devices 109a and 109b. The spacing between, or distance D, between the substrate support 104 and the showerhead assembly may be adjusted during pre-treatment, post-treatment, processing and cleaning in order to vary the ground return RF return paths. In one aspect, the RF devices 109a are configured to be flexible and provide an open circuit for returning RF current based on the position of the substrate support 104 relative to the showerhead assembly 103. In another aspect, the RF devices 109a are configured to be flexible and provide a closed circuit for returning RF current based on the position of the substrate support 104 relative to the showerhead assembly 103. In this embodiment, the flexibility of the RF devices 109a provides a closed circuit in a range of the distance D which allows the spacing between the substrate support 104 and showerhead assembly 103 to be adjusted while various processes are being performed. For example, the substrate support 104 may be moved relative to the showerhead assembly 103 while maintaining a closed circuit with the RF devices 109a.

One embodiment of an RF current path is schematically illustrated by arrows in FIG. 1A. In FIG. 1A, the RF current path may be indicative of RF current flow during processing of the substrate 101. The RF current generally travels from a first lead 123a of the RF power source 105 to the first output 106a of the impedance matching circuit 121, then travels along an outer surface of the conduit 134 to a back surface of the backing plate 116, then to a front surface of the gas distribution plate 114. From the front surface of the gas distribution plate 114, the RF current goes through plasma 108a and reaches a top surface of the substrate 101 or the substrate support 104, then through the plurality of RF devices 109a and/or 109b to an inner surface 125 of the chamber body 102. From the inner surface 125, the RF current returns to a second lead 123b of the RF power source 105 from the impedance matching circuit 121.

Although an example of returning RF current is shown in FIG. 1A and described herein as travelling across or through one or all of the plurality of RF devices 109a and 109b, it is understood that arcing may inadvertently occur between the substrate support 104 and portions of the inner surface 125 of the chamber body 102. Arcing, or arcing potential, may be caused by numerous conditions within the processing volume 111. For example, arcing may be caused at least in part by the position or proximity of the substrate support 104 relative to grounded components of the chamber body 102. Arcing, or arcing potential, is detrimental to processes performed in the system 100. Additionally, components of the system 100 may be damaged by arcing. Thus, reducing or eliminating arcing or arcing potential in PECVD systems is a paramount challenge. The challenges are renewed whenever a process parameter is changed and/or when a larger substrate is used and solving these challenges require a significant amount of research and experimentation that is far beyond routine. The embodiments described herein meet these challenges by providing a RF device that may be utilized to minimize or eliminate arcing in these systems. Thus, in some embodiments, RF current is caused to preferentially flow across or through one or more of the plurality of RF devices 109a, 109b to minimize the potential of arcing between the chamber body 102 and the substrate support 104. Additionally, positioning and/or spacing of the plurality of RF devices 109a, 109b may be adjusted to minimize arcing or arcing potential and/or to enhance RF return.

In some embodiments, the returning RF current may travel across one or more of the plurality of RF devices 109a as the shortest return path from the substrate support 104 and along the inner surface 125 of the sidewall 117b to the second lead 123b. In other embodiments, the returning RF current may travel across one or more of the plurality of RF devices 109b as the shortest return path from the substrate support 104 and along the inner surface 125 of the chamber bottom 117a and along the inner surface of the sidewall 117b to the second lead 123b. The different RF return paths across one or more of the plurality of RF devices 109a and 109b are explained in greater detail below.

RF Return During Processing

In one embodiment, the return path of the RF current during processing may be dependent on a spacing between the substrate support 104 and the showerhead assembly 103, which is depicted as a distance D. The spacing is controlled by the elevation of the substrate support 104. In one embodiment, the distance D is between about 200 mils to about 2000 mils during processing. At this spacing (e.g., elevation of the substrate support 104), the RF devices 109a and 109b may both remain electrically coupled to the RF power source 105. In this embodiment, the RF return path taken by the RF current may be based on the electrical properties and positioning of the RF devices 109a and 109b. The electrical properties include resistance, impedance and/or conductance of the RF devices 109a and 109b. For example, since the plurality of RF devices 109a are closer and have less impedance for the RF current returning to the second lead 123b of the RF power source 105, the RF current flows predominantly through the plurality of RF devices 109a while little or no RF current flows through the plurality of RF devices 109b.

In one embodiment, a plurality of deposition processes may be performed with the substrate support 104 at different elevations or spacings. In one example, a first deposition process may be performed at a first spacing when the distance D is between about 200 mils to about 1500 mils. In this embodiment, the plurality of RF devices 109a and the plurality of RF devices 109b may be electrically coupled to the substrate support 104 such that returning RF current flows across all of the RF devices 109a and 109b. In another example, a second deposition process may be performed at a second spacing when the distance D is greater than about 1200 mils to about 1800 mils, such as greater than about 1500 mils. In this embodiment, the plurality of RF devices 109a may be electrically or physically disconnected from the substrate support 104 such that returning RF current flows solely across RF devices 109b. In another example, other deposition processes may be performed at varied distances D between the first spacing and second spacing such that returning RF current flows across one or both of the plurality of RF devices 109a and 109b.

RF Return During Cleaning

FIG. 1B is a schematic cross-sectional view of the plasma processing system 100 shown in FIG. 1A. In this Figure, the plasma processing system 100 is shown without a substrate to depict a chamber cleaning procedure. In this embodiment, energized cleaning gases are flowed to the showerhead assembly 103 and the processing volume 111 from the remote plasma source 107 to supply a plasma 108b within the processing volume 111. During chamber cleaning, the substrate support 104 is displaced away from the showerhead assembly 103 and RF power from the RF power source 105 may be applied to the processing volume 111 to maintain or further energize the cleaning gas from the remote plasma source 107. In one embodiment, the spacing or distance D of the substrate support 104 relative to the showerhead assembly 103 during chamber cleaning is greater than the spacing or distance D of the substrate support 104 relative to the showerhead assembly 103 during processing. In one embodiment, the distance D between the substrate support 104 and the showerhead assembly 103 during a cleaning process is between about 200 mils to about 5000 mils, or greater.

In one embodiment, a plurality of cleaning steps or processes may be performed with the substrate support 104 at different elevations or spacings. In one example, a first cleaning process may be performed at a first spacing when the distance D is between about 1100 mils to about 1500 mils. In this embodiment, the plurality of RF devices 109a and the plurality of RF devices 109b may be electrically coupled to the substrate support 104 such that returning RF current flows across all of the RF devices 109a and 109b. In another example, a second cleaning process may be performed at a second spacing when the distance D is less than about 1100 mils, such as between about 400 mils to 600 mils. In this embodiment, the plurality of RF devices 109a and the plurality of RF devices 109b may be electrically coupled to the substrate support 104 such that returning RF current flows across all of the RF devices 109a and 109b. In yet another example, a third cleaning process may be performed at a third spacing when the distance D is greater than about 1500 mils, such as between about greater than 1500 mils to about 6000 mils, for example, about 5000 mils. In this embodiment, the plurality of RF devices 109a may be electrically or physically disconnected from the substrate support 104 such that returning RF current flows solely across RF devices 109b. The first, second and third cleaning spacing examples may be used together or separately as desired to clean the chamber and other cleaning processes may be performed at varied distances D between the first spacing and third spacing such that returning RF current flows across one or both of the plurality of RF devices 109a and 109b.

In one embodiment, the elevation of the substrate support 104 causes a condition that substantially prevents RF current from passing through the RF devices 109a. This condition may be caused by providing an open RF circuit in the RF devices 109a, or by changing the electrical, property of the RF devices 109a relative to the RF devices 109b. In one embodiment, the relatively lower position of the substrate support 104 in the cleaning position relative to the processing position causes the RF return current to flow from the substrate support 104 across the RF devices 109b preferentially relative to the RF devices 109a. In one embodiment, the RF devices 109a are detached from one of the sidewall 117b and the substrate support 104 when the substrate support 104 is in this lowered position, thereby creating an RF open condition in the RF devices 109a. In this embodiment, the sole return path for RF current may be across the RF devices 109b. In another embodiment, the RF devices 109a may be connected, but the resistance of the RF devices 109a may be greater than the resistance of RF devices 109b which causes the RF return current to preferentially flow across RF devices 109b. The varied resistance of the RF devices may be provided by temporarily coupling a variable resistance circuit to chosen RF devices 109a.

RF Return in a Pre-Treatment Process

Before a deposition process, it is sometimes desirable to perform a pre-treatment process on the substrate 101. Pre-treatment processes include flowing a pre-treatment gas to the showerhead assembly 103 and striking a plasma within the chamber above the substrate 101. Suitable pre-treatment gases include inert gases or gases free of precursors that may deposit on the substrate, such as argon (Ar), nitrogen ($N_2$), helium (He), ammonia ($NH_3$) and combinations thereof and derivatives thereof, as well as any gas that does not contain a silane, such as $SiH_4$. In one embodiment, a pre-treatment process includes forming a plasma of an inert gas or a gas that does not contain deposition precursors in order to heat the substrate in preparation for a deposition process. Using a plasma of an inert gas facilitates heating of the substrate 101 in conjunction with a heater disposed on the substrate support 104. The pre-treatment heating of the substrate shortens the heating time of the substrate, which increases throughput. In another embodiment, a pre-treatment process includes forming a plasma of an inert gas or a gas that does not contain deposition precursors in order to minimize or eliminate static charges that may have built up in the substrate during substrate transfer. In this embodiment, the plasma redistributes or eliminates electrostatic forces that may have built up in or on the substrate and prepares the substrate for a deposition process.

In one embodiment, the return path of the RF current during a pre-treatment process may be dependent on a spacing between the substrate support 104 and the showerhead assembly 103. The spacing between the substrate support 104 and the showerhead assembly 103, depicted as distance D, may be some position between a processing position and a cleaning position, such as between about 200 mils to about 5000 mils, or greater. Thus, the pre-treatment position of the substrate support 104 relative to the showerhead assembly 103 may include a first or lower position (e.g. between about 1500 mils to about 5000 mils) and a second or high position (e.g. between 200 mils to about 1500 mils).

In this embodiment, the RF return path may include RF current returning to the second lead 123b of the RF power source 105 along one or both of the plurality of RF devices 109a and 109b. In one aspect, the electrical properties of one or both of the plurality of RF devices 109a, 109b may be changed to cause returning RF current to preferentially move across one or both of the plurality of RF devices 109a and 109b. In one embodiment, the elevation of the substrate support 104 causes a condition that substantially prevents RF current from passing through the RF devices 109a. In one embodiment, the elevation of the substrate support 104 is determinative of the path of returning RF current across the plurality of RF devices 109a and 109b. In one example, when the elevation of the substrate support 104 is in the second or high position, the returning RF current flows predominately across the plurality of RF devices 109a. The predominant flow across the RF devices 109a may occur even when the plurality of RF devices 109b are connected to and in electrical communication with the substrate support 104 and the chamber body 102.

In one aspect, the returning RF current may preferentially flow across the RF devices 109b relative to the RF devices 109a. In one embodiment, the RF devices 109a are detached from one of the sidewall 117b and the substrate support 104 when the substrate support 104 is in the first or lower position. In this embodiment, the sole return path for RF current may be across the RF devices 109b. The flow across the RF devices 109b may occur even when the plurality of RF devices 109a are connected to and in electrical communication with the substrate support 104 and the chamber body 102. In another embodiment, the RF devices 109b may be configured to have different electrical properties or configured as open to RF current when the substrate support 104 is in the second or higher position. In this embodiment, the RF return path consists of RF current returning preferentially across the RF devices 109a. In another aspect, the returning RF current flows across one or both of the plurality of RF devices 109a and the plurality of RF devices 109b based on the shortest return path.

RF Return in a Post-Treatment Process

After a deposition process, it is sometimes desirable to perform a post-treatment process on the substrate 101. Post-treatment processes include flowing a post-treatment gas to the showerhead assembly 103 and striking a plasma within the chamber above the substrate 101. Suitable post-treatment gases include inert gases, such as argon (Ar), nitrogen ($N_2$), helium (He), ammonia ($NH_3$), hydrogen ($H_2$) and combinations thereof and derivatives thereof. In one embodiment, a post-treatment process includes forming a plasma of an inert gas in order to minimize residual electrostatic charges on the substrate 101 to assist in lifting the substrate 101 from the upper surface of the substrate support 104. Using a plasma of an inert gas facilitates redistribution of the electrostatic forces acting to hold the substrate 101 to the substrate support 104 and allows the substrate 101 to be moved away from the substrate support 104 for transfer.

In one embodiment, the return path of the RF current during a post-treatment process may be dependent on a spacing between the substrate support 104 and the showerhead assembly 103. The spacing between the substrate support 104 and the showerhead assembly 103, depicted as distance D, may be some position between a processing position and a cleaning position, such as between about 200 mils to about 5000 mils, or greater. Thus, the post-treatment position of the substrate support 104 relative to the showerhead assembly 103 may include a first or low position (e.g. between about 1500 mils to about 5000 mils) and a second or high position (e.g. between 200 mils to about 1500 mils).

In this embodiment, the RF return path may include RF current returning to the second lead 123b of the RF power source 105 along one or both of the plurality of RF devices 109a and 109b. In one embodiment, the position of the substrate support 104 relative to the showerhead assembly 103 and/or the inner surface 125 of the chamber body 102 provides the least resistive path for the RF return. In one aspect, the electrical properties of one or both of the plurality of RF devices 109a, 109b may be changed to cause returning RF current to preferentially move across one or both of the plurality of RF devices 109a and 109b. In one embodiment, the elevation of the substrate support 104 causes a condition that provides a preferential RF return path across the plurality of RF devices 109a. The preferential flow across the RF devices 109a may occur even when the plurality of RF devices 109b are connected to and in electrical communication with the substrate support 104 and the chamber body 102.

In another embodiment, the returning RF current may preferentially flow across the RF devices 109b relative to the RF devices 109a based on the position of the substrate support 104. The preferential flow across the RF devices 109b may occur even when the plurality of RF devices 109a are connected to and in electrical communication with the substrate support 104 and the chamber body 102. In one embodiment, the RF devices 109a are detached from one of the sidewall 117b and the substrate support 104 when the substrate support 104 is in the first or lower position. In this embodiment, the sole return path for RF current may be across the RF devices 109b. In another embodiment, the RF devices 109b may be configured to have different electrical properties or configured as open to RF current when the substrate support 104 is in the second or higher position. In this embodiment, the RF return path consists of RF current returning preferentially across the RF devices 109a. In another aspect, the returning RF current flows across one or both of the plurality of RF devices 109a and the plurality of RF devices 109b based on the shortest return path.

Figure 2A:
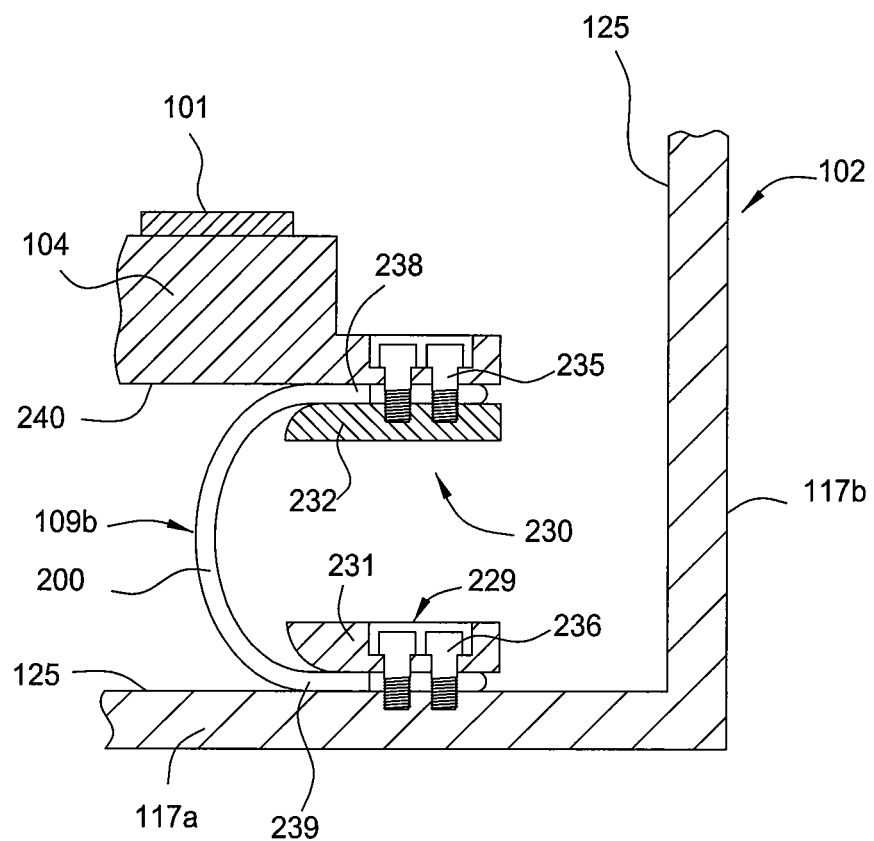
FIG. 2A is a schematic cross-sectional view of one embodiment of a RF device.

FIG. 2A is a schematic cross-sectional view of one embodiment of a RF device 109b configured as a flexible cable, sheet material or a strap 200. A first end 238 of the strap 200 is electrically coupled to the substrate support 104 by a connection assembly 230. In one embodiment, the connection assembly 230 is connected to a lower side 240 of the substrate support 104. A second end 239 of the RF device 109b is electrically coupled to the chamber bottom 117a by a connection assembly 229. The RF device 109b may be coupled to the substrate support 104 and the chamber bottom 117a by other mechanisms such as, for example, fasteners 235, 236, such as screws, clamps or other methods that maintain an electrical connection between the substrate support 104, the RF device 109b, and the chamber bottom 117a. As shown in FIG. 2A, the connection assembly 230 comprises a shaped clamp 232 and one or more fasteners 235. The connection assembly 229 also comprises a shaped clamp 231 and one or more fasteners 236.

The connection assemblies 229, 230 each comprise low impedance conductive materials that are resistant to processing and cleaning chemistries. In one embodiment, the connection assemblies 229, 230 comprise aluminum. Alternatively, the materials may comprise titanium, nickel, stainless steel, alloys or combinations thereof, or other suitable materials. In another embodiment, the materials for the connection assemblies 229, 230 may comprise a nickel-molybdenum-chromium alloy, such as a HASTELLOY® material or a HAYNES® 242® material.

Figure 2B:
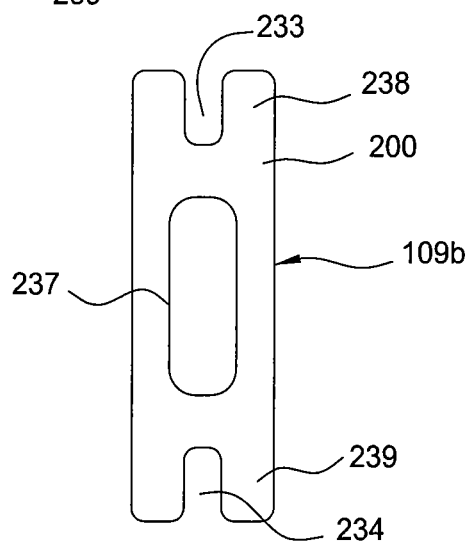
FIG. 2B schematically illustrates an elevation view of the RF device shown in FIG. 2A.

FIG. 2B schematically illustrates an elevation view of the strap 200 shown in FIG. 2A. The strap 200 is generally a flat conductive band which is flexible and does not exert a significant restoring (e.g., spring) force when bent. In one embodiment, the strap 200 comprises a flexible, low impedance conductive material which is resistant to processing and cleaning chemistries. In one embodiment, the strap 200 is comprised of aluminum. Alternatively, the strap 200 may comprise titanium, nickel, stainless steel, beryllium copper, alloys or combinations thereof that is coated, wrapped or clad with aluminum or a conductive metallic sheath or coating. In another embodiment, the strap 200 comprises a nickel-molybdenum-chromium (Ni—Mo—Cr) alloy, such as a HASTELLOY® material or a HAYNES® 242® material. The Ni—Mo—Cr alloy material may be coated, wrapped or clad with aluminum or a conductive metallic sheath or coating.

In one embodiment, the first end 238 of the strap 200 has a mounting slot 233 and the second end 239 has a mounting slot 234. In one embodiment, the strap 200 has a central slot 237 configured to increase the flexibility of the strap 200 and/or to facilitate clearance for a lift pin shaft, such as the shafts of the lift pins 110a-110d shown in FIGS. 1A-1B. In one aspect, the central slot 237 is sized larger than a diameter of a lift pin shaft to facilitate bending of the strap 200 when the RF device 109b is adjacent a lift pin.

Figure 3A:
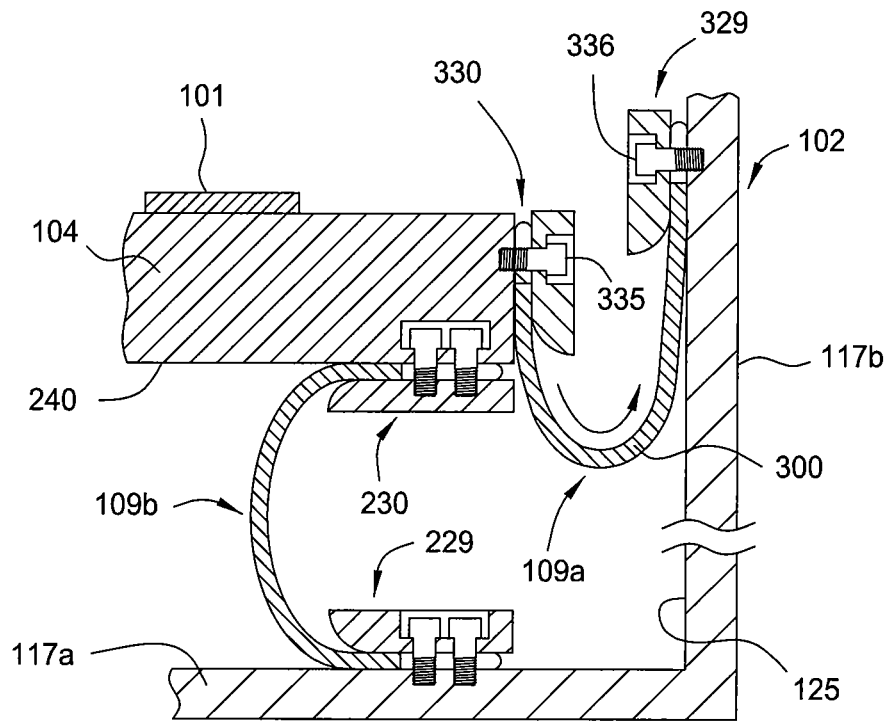
FIG. 3A is a schematic cross-sectional view of another embodiment of a RF device.

FIG. 3A is a schematic cross-sectional view of one embodiment of a RF device 109a configured as a flexible cable, sheet material or a strap 300. In one embodiment, the RF device 109a shown in FIG. 3A may be used in the chamber body 102 to provide an electrically conductive path between the substrate support 104 and the sidewalls 117b in portions of the chamber where the sidewalls 117b are flat or continuous and do not include a substrate transfer port. Respective ends of the RF device 109a include connection assemblies 329 and 330 configured similarly to the connection assemblies 229 and 230 of FIG. 2A. Fasteners 335 and 336 couple the RF device 109a to the substrate support 104 and sidewall 117b of the chamber body, respectively. The strap 300 is generally a flat conductive band which is flexible and does not exert a significant restoring (e.g., spring) force when bent. In one embodiment, the RF device 109a comprises a flexible, low impedance conductive material which is resistant to processing and cleaning chemistries. In one embodiment, the strap 300 is comprised of aluminum. Alternatively, the strap 300 may comprise titanium, nickel, stainless steel, beryllium copper, alloys or combinations thereof that is coated, wrapped or clad with aluminum or a conductive metallic sheath or coating. In another embodiment, the strap 300 comprises a nickel-molybdenum-chromium (Ni—Mo—Cr) alloy, such as a HASTELLOY® material or a HAYNES® 242® material. The Ni—Mo—Cr alloy material may be coated, wrapped or clad with aluminum or a conductive metallic sheath or coating.

In this embodiment, the position of the substrate support 104 is a raised position, which may be a processing position. The raised position of the substrate support 104 spaces the substrate support 104 away from the chamber bottom 117a, which stretches, straightens or elongates the RF device 109b. In one embodiment, the less resistive path for RF current may be along the RF device 109a based on the greater distance and/or resistance posed by the elongated orientation of the RF device 109b. In one example, the less resistive path for returning RF current may be in the direction of the arrow such that the returning RF current may preferentially travel along RF device 109a instead of along RF device 109b. In other embodiments, at least a portion of the returning RF current may travel along one or both of the RF devices 109a and 109b.

Figure 3B:
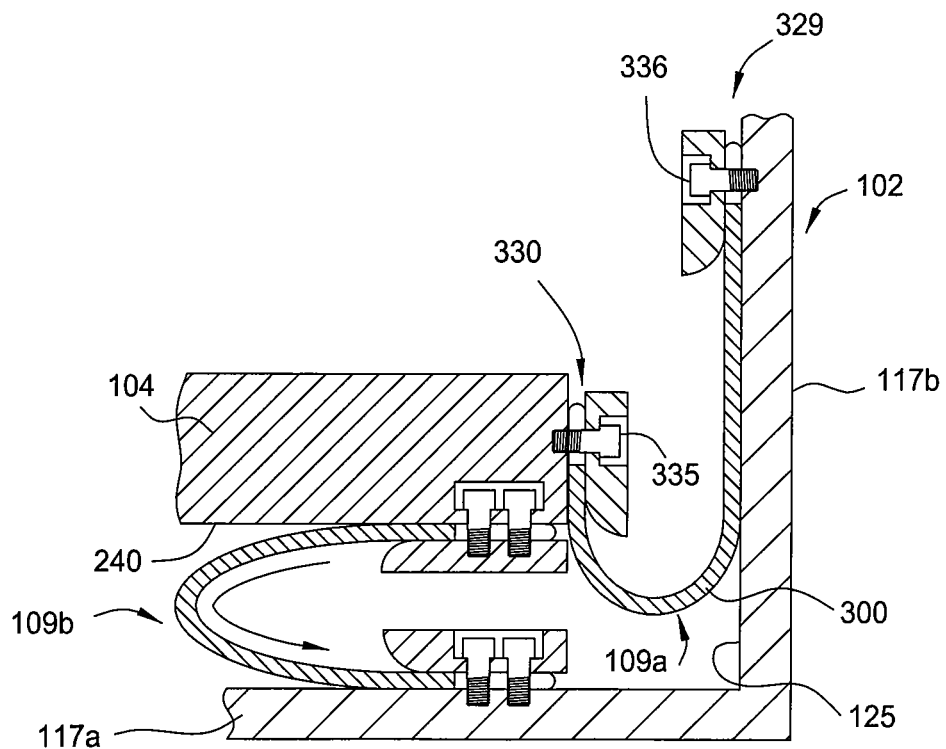
FIG. 3B is a schematic cross-sectional view the RF device of FIG. 3A.

FIG. 3B is a schematic cross-sectional view the RF devices 109a and 109b of FIG. 3A. In this embodiment, the substrate support 104 is in a lowered position, which may be a transfer position or a cleaning position. The lowered position of the substrate support 104 brings the substrate support 104 in close proximity to the chamber bottom 117a, and the RF device 109a is stretched, straightened or elongated. In one embodiment, the less resistive path for RF current may be along the RF device 109b based on the greater distance and/or resistance posed by the elongated orientation of the RF device 109a. In one example, the less resistive path for returning RF current may be in the direction of the arrow such that the returning RF current may travel preferentially along RF device 109b instead of along RF device 109a. In other embodiments, at least a portion of the returning RF current may travel along one or both of the RF devices 109a and 109b.

Figure 4:
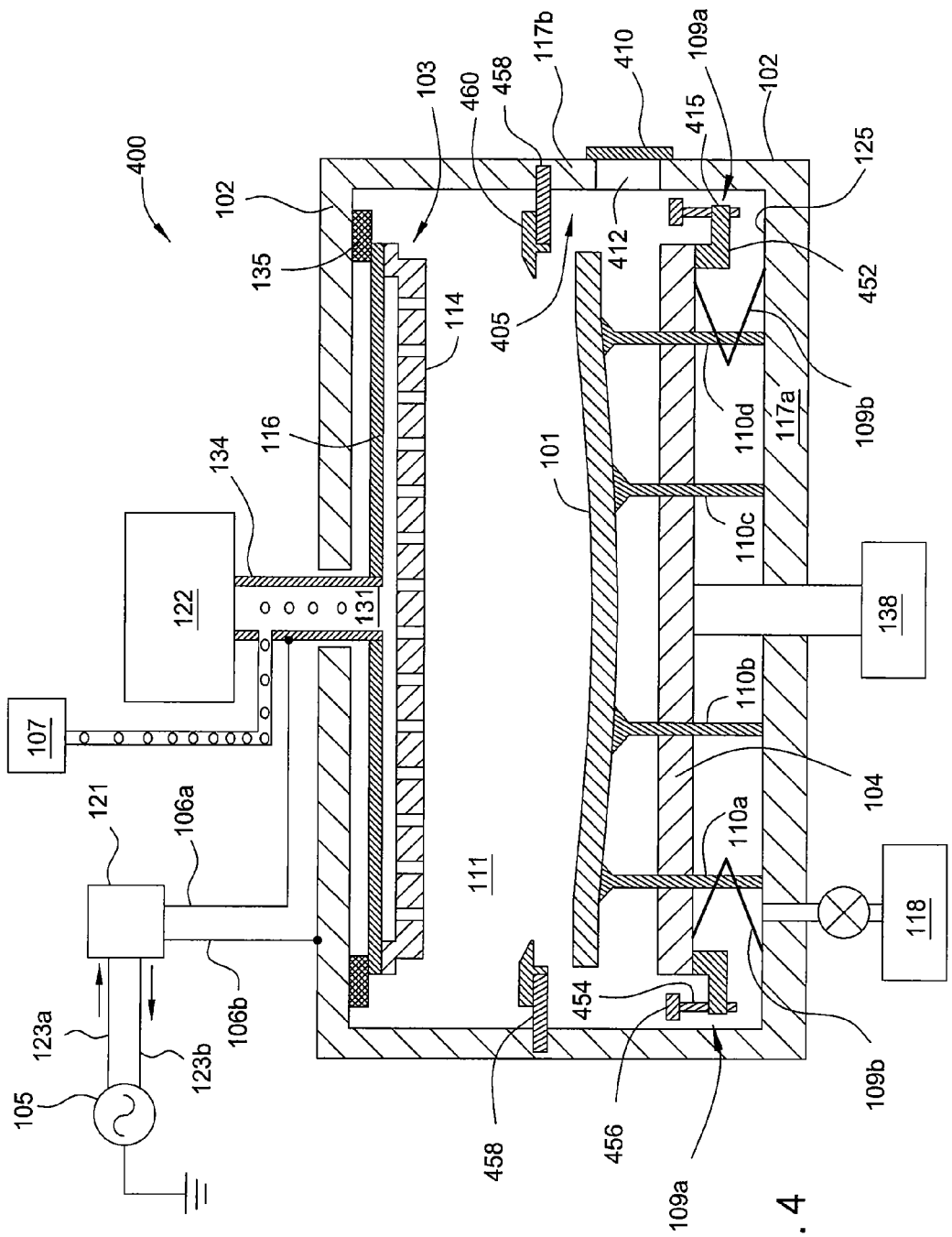
FIG. 4 is a schematic cross sectional view of another embodiment of a plasma processing system.

FIG. 4 is a schematic cross sectional view of another embodiment of a plasma processing system 400. Portions of the plasma processing system 400 are similar to plasma processing system 100 shown in FIGS. 1A and 1B and are not duplicated for brevity. In this embodiment, the substrate support 104 is shown in a transfer position. In this embodiment, at least one of the sidewalls 117b includes a substrate transfer port 412 sized to allow passage of a substrate 101 retained on a factory transfer device, such as a robot or end effector (not shown). The transfer port 412 may be configured as a slit valve and includes a sealable door 410 adapted to open the transfer port 412 during substrate transfer and seal the processing volume 111 when closed. One or more lift pins 110a-110d extend through the substrate support 104 to support the substrate 101 when the substrate 101 is received from the end effector (not shown) through the port 412 and when the substrate is ready to be received by the end effector.

A sidewall area 405 is shown adjacent the transfer port 412. The sidewall area 405 is different than other portions of the sidewall 117b as the transfer port 412 includes a passage or void formed in the inner surface 125 of the sidewall 117b that is not present in other portions of the sidewalls 117b of the chamber body 102. For example, if the chamber body is rectangular, three of the sidewalls 117b are flat and/or include a substantially planar and continuous inner surface 125 while a fourth sidewall 117b includes the sidewall area 405 that is non-flat and/or non-continuous because of the passage defining the transfer port 412. The differences between the inner surfaces 125 of the three sidewalls and the inner surface of the sidewall area 405 produce incongruent RF return patterns. In one example, RF power applied to the chamber does not a travel symmetrically within the processing volume 111. In one aspect, the existence of the transfer port 412 provides a space where RF current may not concentrate or is minimal because the passage or space defining the transfer port 412 does not conduct RF current. This results in uneven plasma at or near the port 412 and uneven deposition on the substrate 101 in the area at or near the transfer port 412 relative to other portions of the substrate 101. The different sidewalls require different RF return schemes to optimize the RF return and/or prevent arcing in the sidewall area 405. In one embodiment, three of the sidewalls 117b that do not include the transfer port 412 may include the RF devices 109a utilizing straps 300 as shown in FIGS. 3A and 3B. However, the RF devices 109a on the side of the substrate support 104 adjacent the transfer port 412 are adapted to move with the substrate support 104, in one embodiment, in order to provide clear access for substrate transfer between the lift pins 110a-110d and the transfer port 412.

In this embodiment, at least a portion of the RF devices 109a are depicted as a plurality of compressible contact members 415. The compressible contact members 415 may be coupled directly to the substrate support 104 or by a bracket 452. The compressible contact members 415 are thus movable with the substrate support 104. In one embodiment, each of the contact members 415 includes a contact portion 456 adapted to contact one or more plates or extended members 458 coupled to the sidewalls 117b of the chamber body 102. In one aspect, each of the extended members 458 comprise a plurality of discrete plates extending from the inner surface 125 of the chamber body 102. In one embodiment, the contact portion 456 and extended members 458 comprise a conductive material and are utilized to provide a path for electrical current. Each of the compressible contact members 415 also include an elastic portion 454 adapted to compress and expand or decompress in response to contact between the contact portion 456 and a respective extended member 458 based on the elevation of the substrate support 104. In one embodiment, the plasma processing system 400 includes a shadow frame 460 adapted to circumscribe at least a portion of the perimeter of the substrate 101 and the substrate receiving surface of the substrate support 104 during processing.

When the substrate support 104 is in a transfer position as shown, the shadow frame 460 may rest on an upper surface of the extended members 458.

Figure 5:
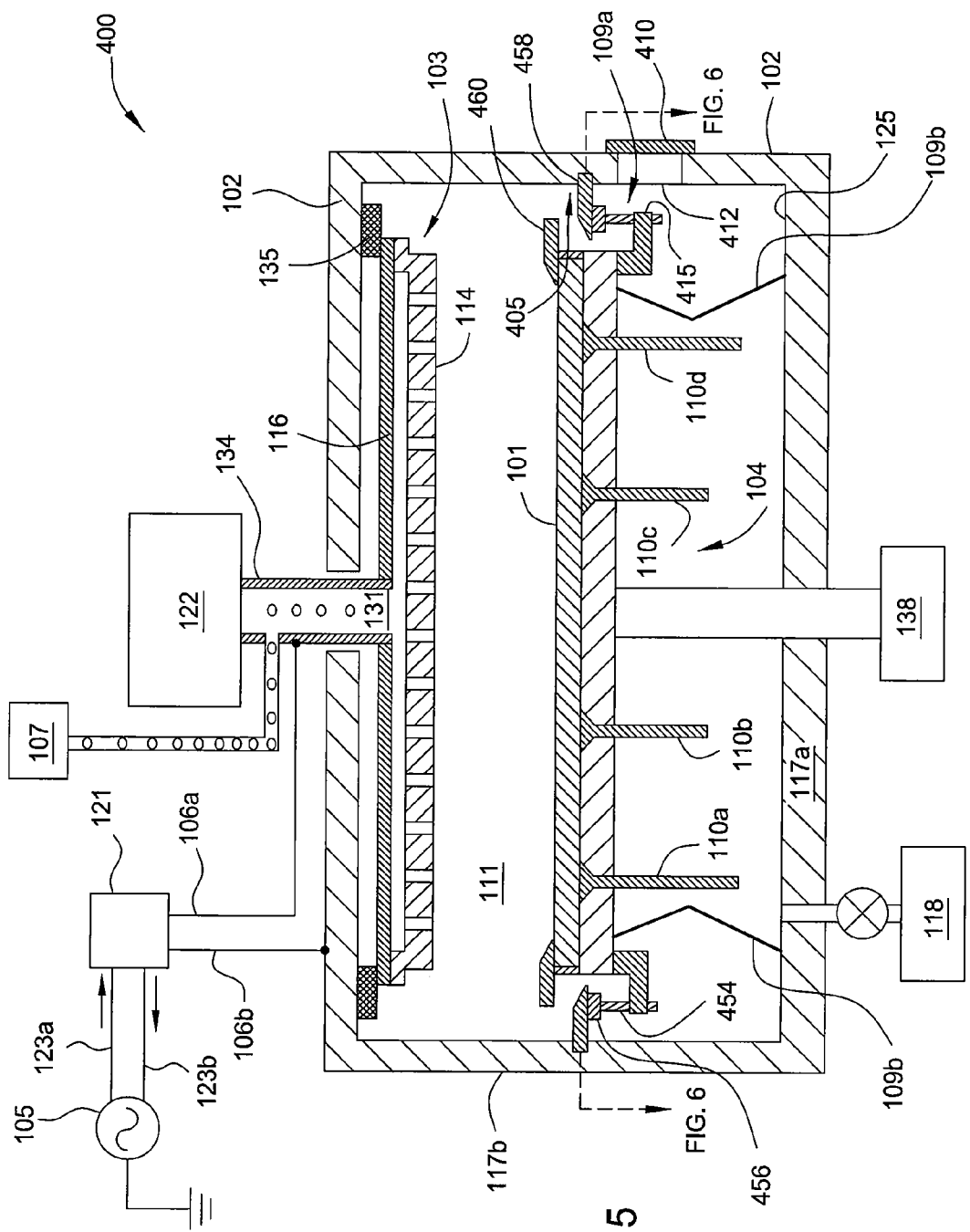
FIG. 5 is a schematic cross sectional view of the processing chamber of FIG. 4.

FIG. 5 is a schematic cross sectional view of the processing system 400 of FIG. 4 showing the substrate 101 in a processing position. After the end effector (not shown) places the substrate 101 onto the lift pins 110a-110d as shown in FIG. 4, the end effector retracts from the processing volume 111 and the door 410 may be closed to seal the transfer port 412. The substrate support 104 then raises while the lift pins 110a-110d remain stationary until the substrate support 104 is in the processing position. While the substrate support 104 moves to the processing position, the substrate support 104 comes into contact with the substrate 101 supported by the lift pins 110a-110d. The substrate 101 begins to contact the substrate support 104 in a center to edge manner due to the sagging of the substrate 101. The lift pins 110a-110d remain stationary as the substrate support 104 raises until the substrate support 104 has raised to a position such that the substrate 101 supported by the lift pins 110a-110d is supported by the substrate support 104.

By raising the substrate support 104, the lift pins 110a-110d are lowered relative to the substrate receiving surface of the substrate support 104 to place the substrate 101 on the substrate receiving surface in a substantially flat orientation. In embodiments where a shadow frame 460 is utilized, the shadow frame 460 is contacted by the substrate 101 and/or substrate support 104 to lift the shadow frame 460 from a resting position to circumscribe the substrate 101 and/or the substrate support 104. At some position after the substrate 101 contacts the substrate support 104, a pre-treatment process as described above may be performed on the substrate 101. Lifting of the substrate support 104 also provides contact between the contact portions 456 of the RF devices 109a and the extended members 458. Thus, returning RF current may be facilitated by the RF devices 109a and/or 109b in this embodiment.

Figure 6:
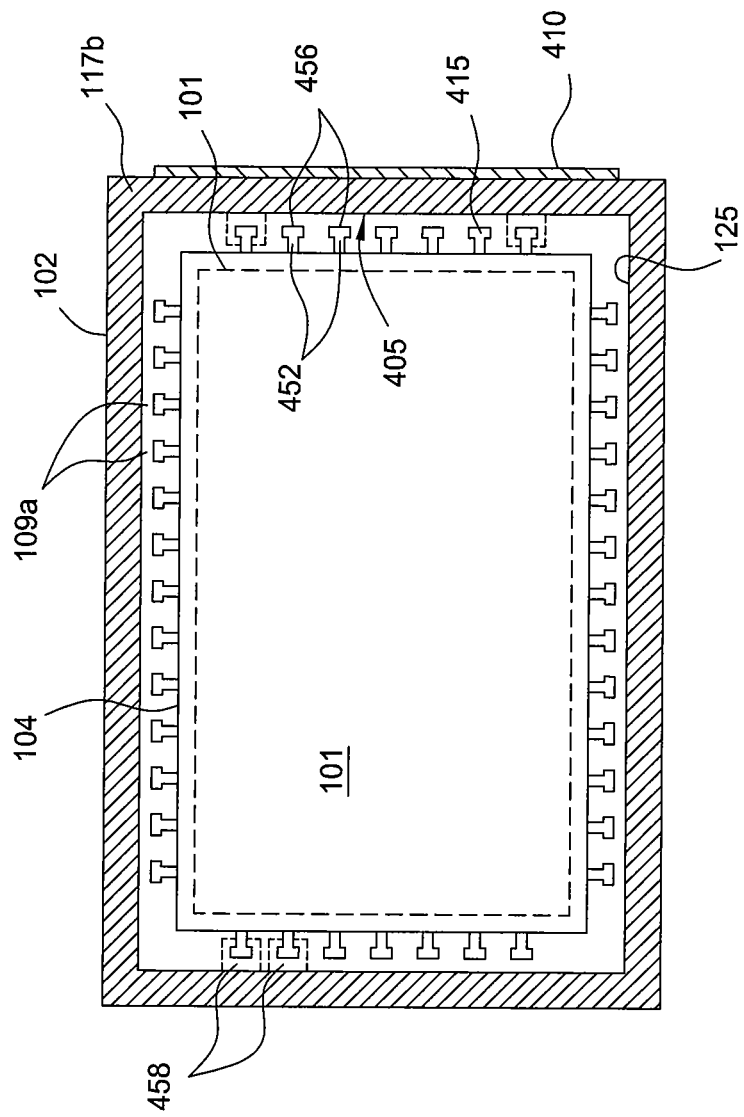
FIG. 6 is a schematic cross-sectional top view of the chamber of FIG. 5 taken from lines 6-6.

FIG. 6 is a schematic cross-sectional top view of the chamber body 102 taken along lines 6-6 of FIG. 5 to show one embodiment of the positioning of the RF devices 109a. The chamber body 102 is shown with the substrate support 104 disposed therein and the RF devices 109a are disposed in a space between the interior surface of the chamber body 102 and the substrate support 104. The contact portions 456 are adapted to contact the extended members 458 (four are shown in phantom) to provide a RF return path for the applied RF power. The spacing and concentration of the RF devices 109a are configured to provide symmetry in the RF return path to facilitate plasma uniformity and enhanced deposition uniformity on the substrate 101 (shown in phantom).

In one embodiment, the spacing and concentration of the RF devices 109a is adapted to provide a symmetrical appearance to the applied RF power to account for variances in the chamber construction, such as the passage defined by the transfer port 412. The spacing or concentration allows the applied RF power to travel symmetrically in the processing volume 111 when the chamber may not be physically and/or electrically symmetrical. In one aspect, each of the RF devices 109a and extended members 458 are adapted as individual or modular units that may be coupled to the substrate support 104 at desired positions and may be moved or removed from an existing position, if desired. The modular adaptation allows the RF return path to be tuned by adding, removing, or repositioning RF devices 109a as desired. In one embodiment, the RF devices 109a are substantially evenly spaced around the perimeter of the substrate support 104. In other embodiments, the RF devices 109a may be added or removed from different locations of the substrate support 104, as needed.

Figure 7A:
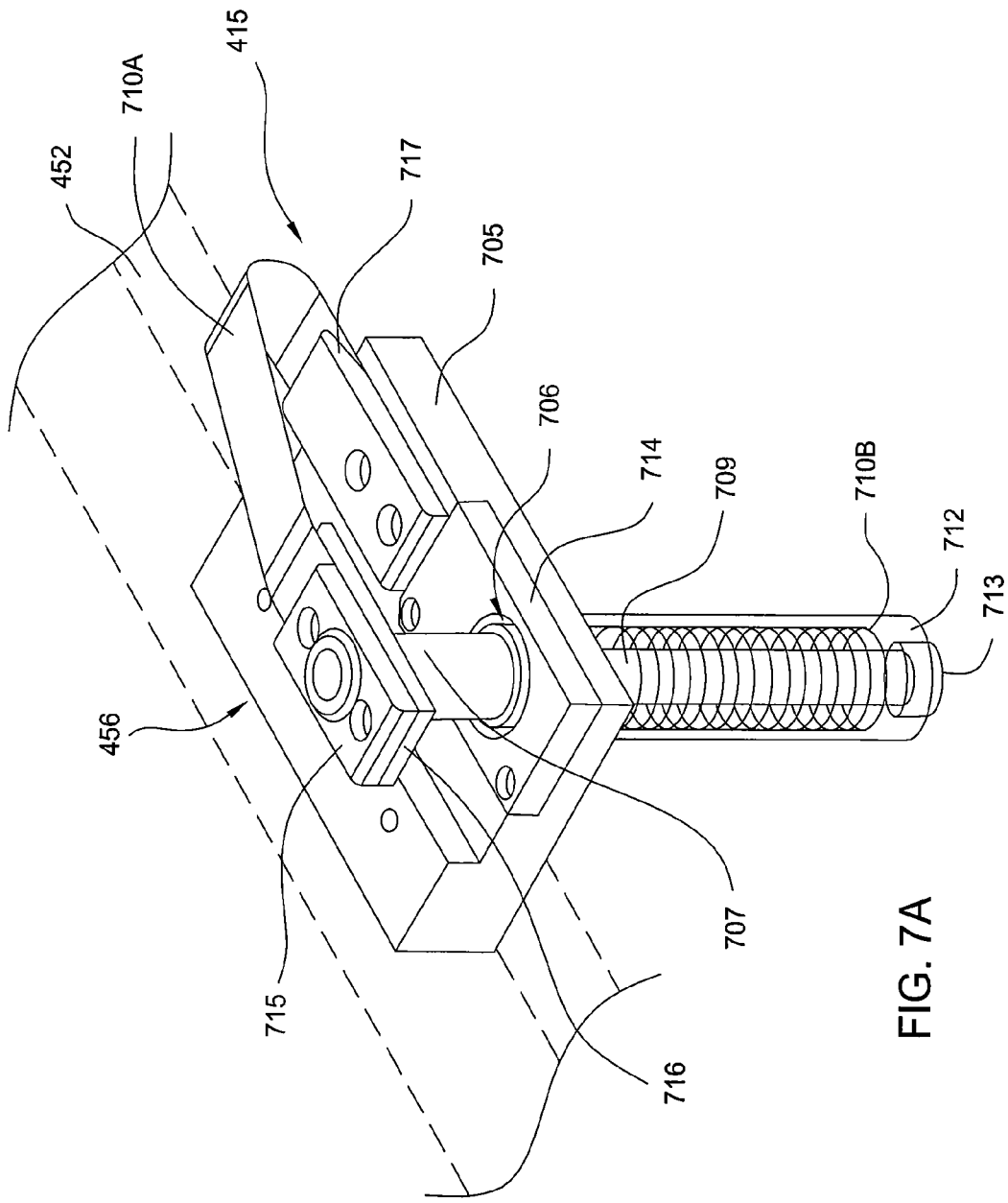
FIG. 7A is an isometric view of another embodiment of a RF device.
Figure 7C:
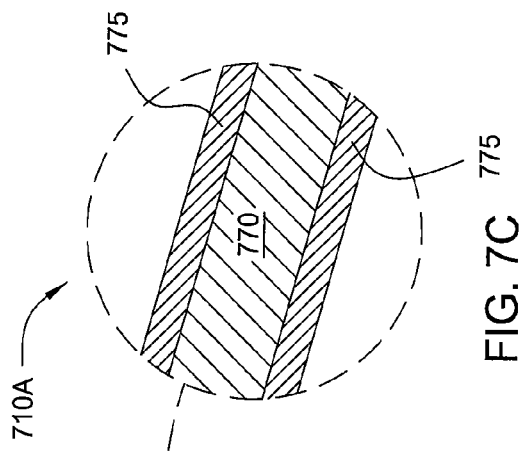
FIG. 7C is an enlarged cross-sectional view of a portion of the spring form of FIG. 7B.
Figure 7B:
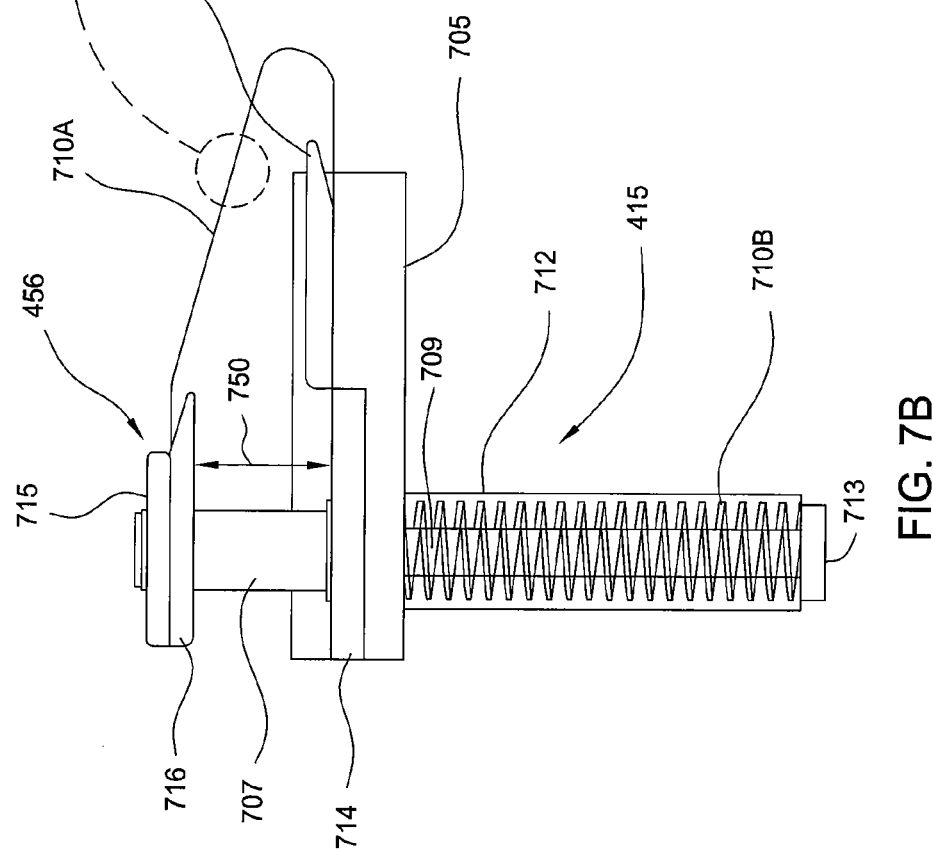
FIG. 7B is a side view of the RF device shown in FIG. 7A.

FIGS. 7A and 7B are isometric and side views, respectively, of one embodiment of a RF device 109a depicted as a compressible contact member 415. In this embodiment, the compressible contact member 415 is mounted on a base 705 that may be coupled to the bracket 452 (shown in phantom). In another embodiment, the contact member 415 may be integrated to be part of the bracket 452. The bracket 452, in turn, would be coupled to a substrate support 104 (not shown). In one embodiment, the base 705 includes an opening 706 adapted to receive a first shaft 707. The first shaft 707 is movably disposed through the opening 706 to provide relative movement between the base 705 and the first shaft 707. The first shaft 707 is coupled to a second shaft 709 that is received inside the spring form 710B. A collar 713 is coupled to the second shaft 709 to provide a base for the spring form 710B. In one embodiment, the first shaft 707 is movable to any position within a travel distance indicated as 750 in FIG. 7B. The travel distance 750 corresponds to the distance range that the substrate support 104 may be adjusted during various processes while maintaining electrical contact or grounding potential between the substrate support 104 and the chamber body 102.

The compressible contact member 415 includes at least one elastic portion, shown in this embodiment as spring forms 710A and 710B. Spring forms 710A, 710B provide elasticity to the compressible contact member 415 while spring form 710A additionally provides a conductive path for electrical current. In one embodiment, the spring form 710B is coupled to a tubular member 712 having a mounting portion 714 that houses the spring form 710B and provides a mounting interface to couple with the base 705.

The compressible contact member 415 includes a contact pad 715 coupled to a head portion 716 of the first shaft 707. A first end of the spring form 710A is coupled to and in electrical communication with the contact pad 715 and in one embodiment is sandwiched between the head portion 716 and the contact pad 715. Fasteners, such as bolts or screws may be used to couple the contact pad 715 to the head portion 716. The second end of the spring form 710A is coupled to and in electrical communication with the base 705 by a contact pad cap 717 which, in one embodiment, sandwiches the spring form 710A to the base 705. Fasteners, such as bolts or screws may be used to couple the contact pad cap 717 to the base 705.

Referring to FIGS. 7A and 7B, spring forms 710A, 710B may be a flexible material made with conductive or composite materials having properties that carry or conduct an electrical current. In one embodiment, the flexible material may be sheet material, such as sheet metal or foil, a cable or wire, and combinations thereof, or other conductive elastic member or conductive material. The spring forms 710A, 710B may be exposed to the processing environment in the plasma processing systems 100 and 400 as described herein and the flexible materials are chosen to survive and operate in the extremes encountered in the processing environments. In one embodiment, the flexible material for the spring forms 710A, 710B may be a metal or metal alloy that substantially retains flexible properties, such as mechanical integrity and/or spring properties, during processing conditions. In one aspect, a first or core flexible material for the spring forms 710A, 710B includes any metal or metal alloy that substantially retains flexible properties when the flexible material reaches temperatures above 200° C., for example temperatures above about 250° C. to about 300° C. In one embodiment, the flexible property of the first or core material retained at the temperature above 200° C. or up to and including 300° C. is substantially similar to the flexible property of the core material at ambient temperature.

In some embodiments, the flexible material may be in the form of a flat spring, a coil spring, a compression spring or other flexible spring device or spring form. In one embodiment, the spring forms 710A, 710B comprise a metallic material or metallic alloy, which may additionally be coated, wrapped or clad with a conductive material. Examples of metals and metal alloys include nickel, stainless steel, titanium, a MONEL® material, a HASTELLOY® material, a HAYNES® alloy, such as a HAYNES® 242® material, beryllium copper, or other conductive elastic materials. Examples of conductive materials for the coating, wrapping or cladding include aluminum, anodized aluminum, or other coating, film, or sheet material. In one embodiment, the spring form 710A comprises a nickel or titanium alloy sheet material that is wrapped or covered with an aluminum material. In another embodiment, the spring form 710A comprises a Ni—Mo—Cr alloy, such as a HASTELLOY® material or a HAYNES® 242® material. The Ni—Mo—Cr alloy material may be coated, wrapped or clad with aluminum or a conductive metallic sheath or coating. In one embodiment, the spring form 710B comprises a MONEL® 400 material while the spring form 710A comprises a HAYNES® 242® material wrapped with an aluminum foil.

The base 705, the pad 715, the cap 717, the first shaft 707 and the tubular member 712 may be made of a conductive material and additionally may be coated or wrapped with a conductive material. Examples of conductive material include aluminum, anodized aluminum, nickel, titanium, stainless steel, alloys thereof or combinations thereof. In one embodiment, the pad 715, cap 717, first shaft 707 and tubular member 712 are made of an anodized aluminum material or a conductive material such as nickel, titanium, stainless steel, alloys thereof or combinations thereof, and coated, wrapped or clad with a conductive material, such as aluminum.

FIG. 7C is an enlarged view of a portion of the spring form 710A of FIG. 7B in cross-section. In one embodiment, the spring form 710A includes a first or core material 770 and second material or outer material 775. In one embodiment, the core material 770 and the outer material 775 comprise the same material, such as a conductive material that is resistant to process chemistries and the process environment. For example, the core material 770 and the outer material 775 may comprise aluminum. The aluminum material provides a conductive outer covering that is highly resistant to process chemistries. However, the physical and/or mechanical attributes of aluminum materials may degrade at elevated temperatures and/or repeated compression and decompression. In one example, aluminum includes properties such as tensile strength and modulus of elasticity (Young's modulus) that decrease with increases in temperature. Additionally, yield stress of aluminum may be dramatically lessened at temperatures above about 205° C. and is diminished to a greater extent at higher temperatures. For example, the ultimate tensile strength value of aluminum at a temperature of about 200° C., or greater, is about 40% to about 60% less than the ultimate tensile strength value of aluminum at ambient temperature. Thus, while aluminum may be utilized for the spring form 710A, repeated cycling (compression and decompression) and/or elevated temperatures may cause a loss in ductility and may result in failure of the spring form 710A.

In another embodiment, the core material 770 is different than the outer material 775 and the outer material 775 is supported by the core material 770. In one embodiment, the core material 770 comprises a material that retains physical and/or mechanical properties at elevated temperatures while the physical and/or mechanical properties of the outer material 775 may be diminished at elevated temperatures. In one aspect, the flexible and/or ductile properties of the core material 770 retained at temperatures above about 200° C. is substantially similar to the flexible and/or ductile properties of the core material 770 at ambient temperature. For example, the outer material 775 may be aluminum while the core material 770 may be a metallic alloy. In one embodiment, the core material 770 has substantially the same properties at ambient temperature or room temperature (e.g., about 25° C.) as when the core material 770 reaches temperatures of about 200° C. or greater. In one aspect, the core material 770 has an ultimate tensile strength of about 1250 MPa to about 1290 MPa at room temperature and an ultimate tensile strength of about 1050 MPa to about 1100 MPa at about 425° C. Therefore, the ultimate tensile strength of the core material 770 is substantially unchanged at temperatures between room temperature and about 200° C. and the core material 770 thus retains mechanical integrity at the elevated temperatures. In one embodiment, at about 200° C., the core material 770 retains substantially 85% of the physical and/or mechanical properties possessed at ambient temperature. In another embodiment, at about 200° C., the core material 770 retains substantially 90% or greater, such as about 95%, of the physical and/or mechanical properties possessed at ambient temperature.

The core material 770 provides mechanical and/or physical properties that are superior to the aluminum outer material 775 at temperatures above about 200° C. In one aspect, the core material 770 and the outer material 775 differ as the outer material 775 may reach a fatigue limit in a shorter time period than the core material 770 due to the elevated temperatures and/or repeated compression and decompression. In one embodiment, the core material 770 is made from a Ni—Mo—Cr alloy, such as a HASTELLOY® material or a HAYNES® 242® material. The Ni—Mo—Cr alloy has excellent ductility and yield strength retention at temperatures above 200° C., particularly at temperatures greater than about 205° C., for example, between about 210° C. and about 300° C. At these elevated temperatures, a solid aluminum spring form 710A may experience a ductility loss. However, the outer material 775 (aluminum) may be in the form of a coating or foil that is coupled to the core material 770 and any weakening of the outer material 775 does not affect the mechanical stability of the core material 770. Thus, the spring form 710A is resilient and retains mechanical integrity of the spring form 710A at elevated temperatures. Although the Ni—Mo—Cr alloy material has excellent corrosion resistant properties, especially in fluorine-containing environments, the outer material 775 may protect the core material 770 from plasma and/or gases in the processing volume 111.

Figure 8A:
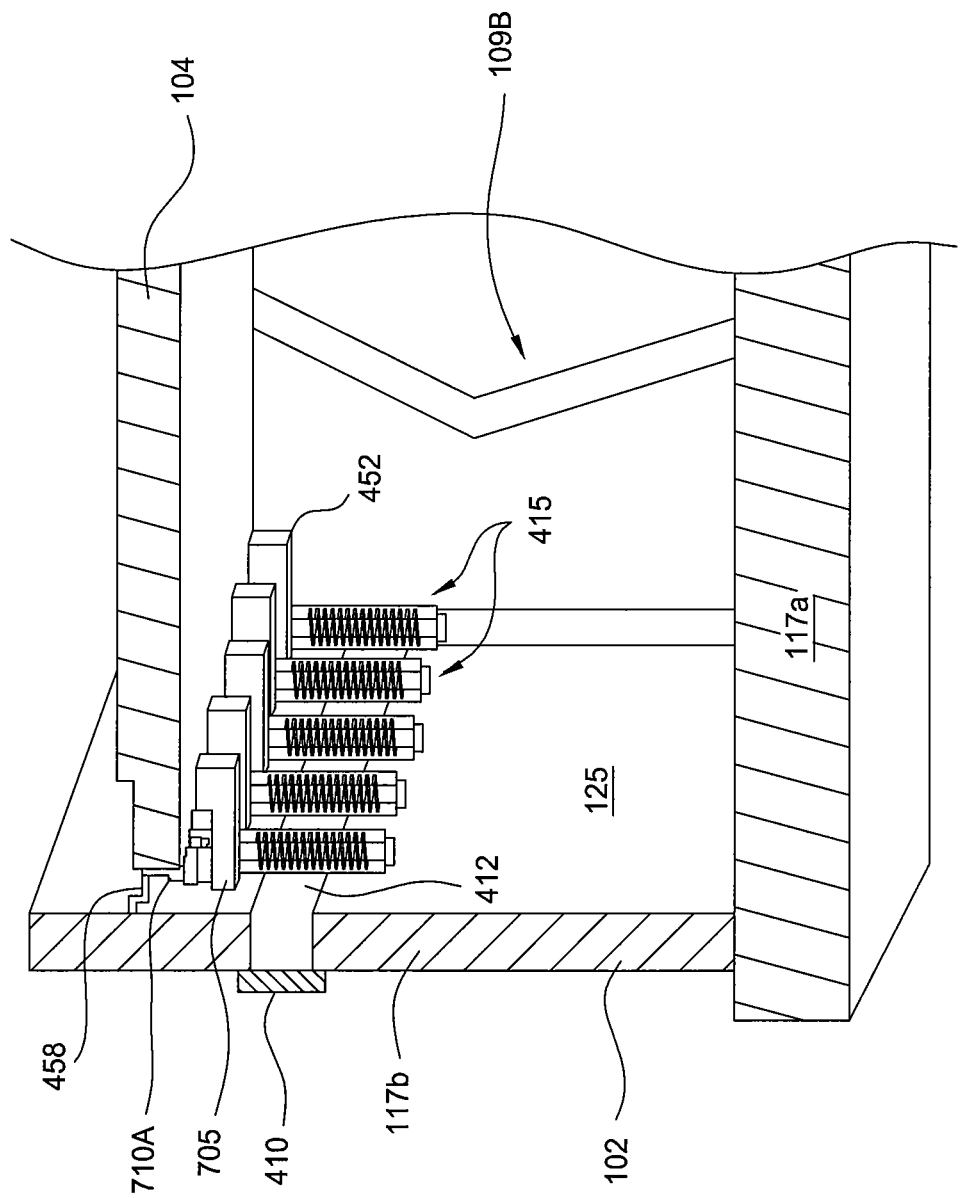
FIG. 8A is an isometric cross-sectional view of one embodiment of coupling arrangement for a plurality of compressible contact members as seen from an interior of the chamber body.

FIG. 8A is an isometric cross-sectional view of one embodiment of coupling arrangement for a plurality of compressible contact members 415 as seen from an interior of the chamber body 102. The substrate support 104 is shown in a raised position such that the contact pads 715 (not shown in this view) are in contact with the extended members 458 extending from the inner surface 125 of the sidewall 117b. In this embodiment, each of the compressible contact members 415 are coupled to an individual bracket 452. Each of the brackets 452 are coupled to the substrate support 104. The brackets 452 may be added or removed as desired in order to tune the RF return path adjacent the transfer port 412.

Figure 8B:
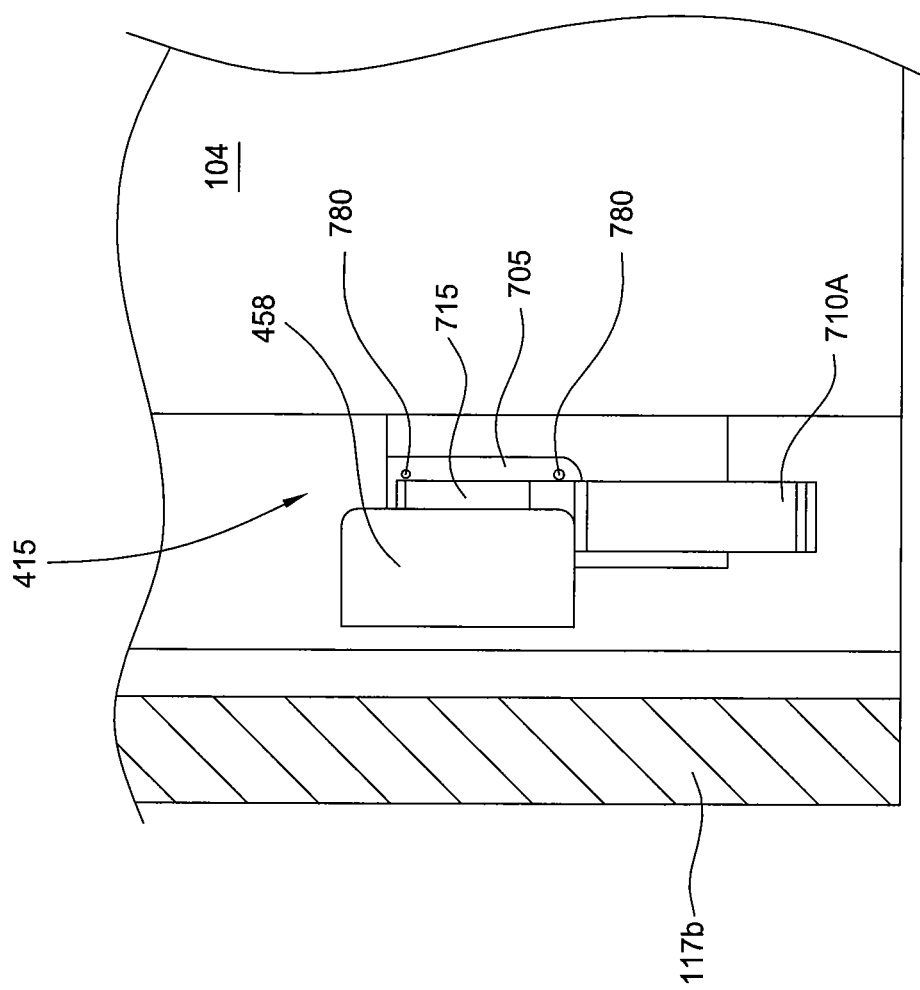
FIG. 8B is a top view of a portion of the chamber body of FIG. 8A.

FIG. 8B is a top view of a portion of the chamber body 102 of FIG. 8A. A portion of the contact pad 715 is shown below the extended member 458. It is noted that the compressible contact member 415 is accessible between the side of the chamber body 102 and the substrate support 104. Thus, when the substrate support 104 is lowered to a position below the transfer port 412, the compressible contact members 415 may be accessed within the chamber body 102 from a position above the substrate support 104 through the transfer port 412 for maintenance, inspection, replacement or removal by personnel. In one embodiment, two fasteners 780 coupling the base 705 to the bracket 452 may be removed to disengage the base 705 from the bracket 452. Thus, the compressible contact member 415 may be easily removed or replaced by removal or attachment of the two fasteners 780, respectively.

Figure 9A:
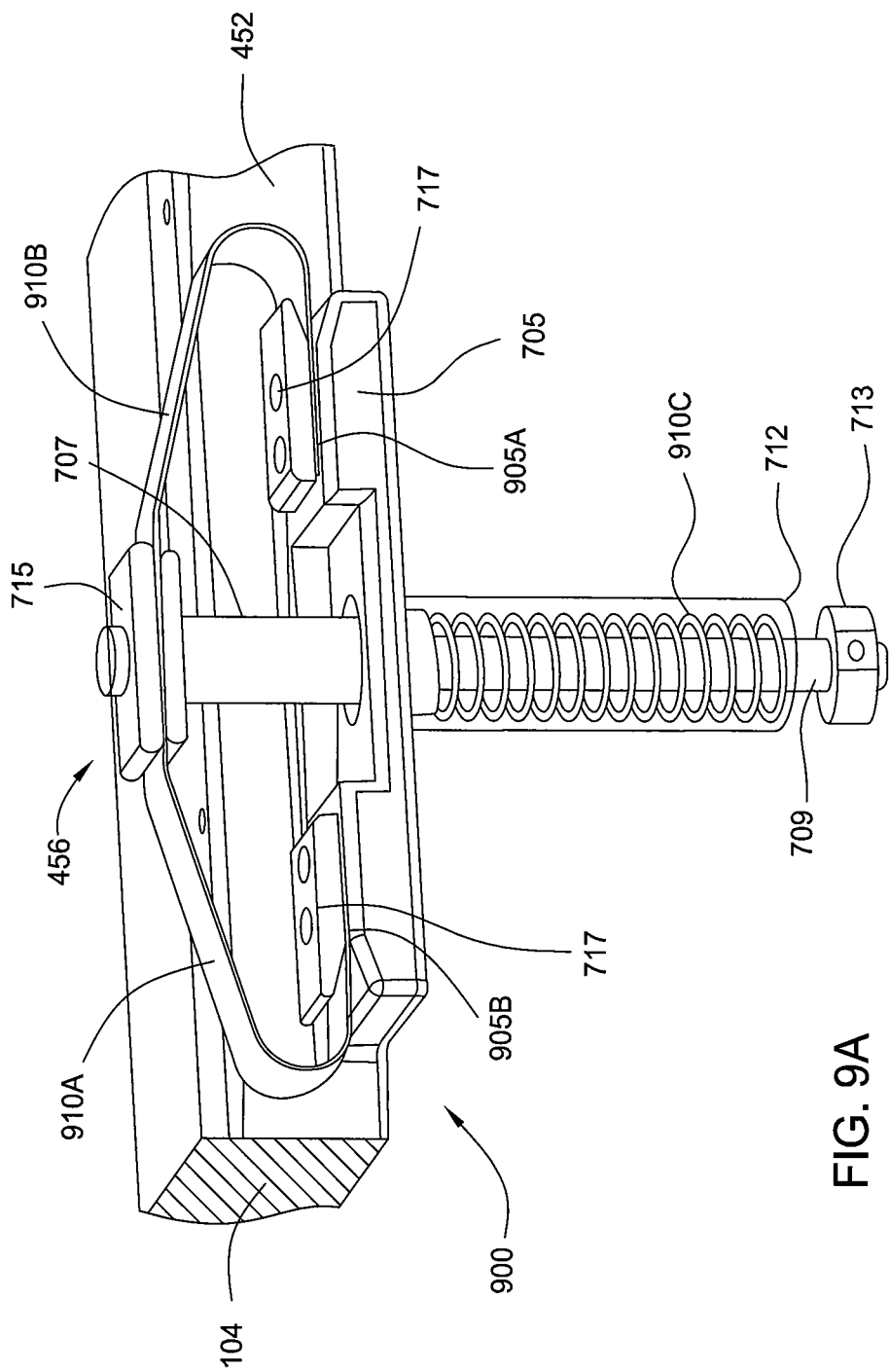
FIG. 9A is an isometric view of another embodiment of a compressible contact member.

FIG. 9A is an isometric view of another embodiment of a compressible contact member 900 coupled to a bracket 452. In this embodiment, the bracket 452 is configured as a bar that is coupled to a substrate support 104. In this embodiment, the compressible contact member 900 is similar to the compressible contact member 415 shown in FIGS. 8A-8B with the exception of three spring forms 910A-910C. Spring forms 910A, 910B may be made of materials having properties that carry or conduct an electrical current. In one embodiment, each of the spring forms 910A-910C may be made of the same materials as the spring forms 710A, 710B described in FIGS. 8A-8B.

In one embodiment, the spring forms 910A, 910B may be a continuous single sheet material or a single flat spring having two ends 905A, 905B. Alternatively, the spring forms 910A, 910B may be two separate, discontinuous pieces of sheet material or two flat springs coupled at respective ends at the contact pad 715. In this embodiment, a collar 713 is shown that is coupled to a second shaft 709 disposed within the tubular member 712. The collar 713 may be made of a conductive material, such as aluminum or anodized aluminum. The collar 713 may comprise a nut or include a threaded portion for a set screw that is adapted to fix to the second shaft 709. The second shaft 709 may be of a reduced dimension, such as a diameter, to allow the spring form 910C to fit thereover.

Figure 9B:
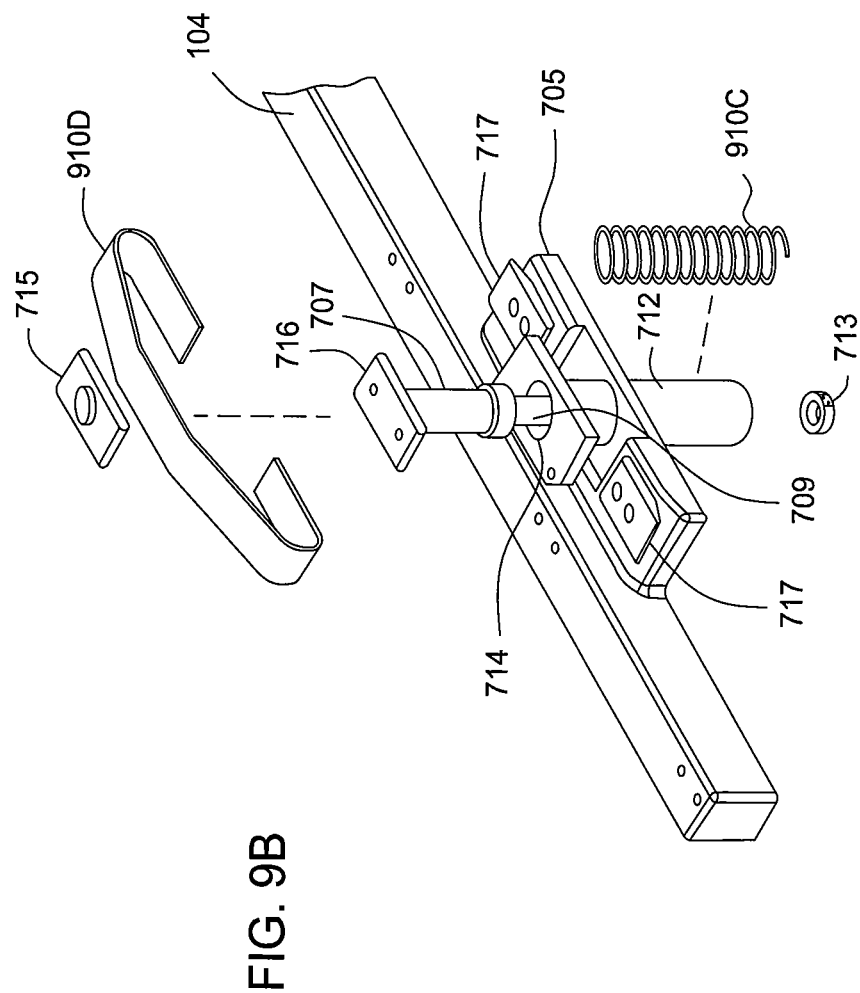
FIG. 9B is an exploded isometric view of the compressible contact member shown in FIG. 9A.

FIG. 9B is an exploded isometric view of the compressible contact member 900 shown in FIG. 9A. In this embodiment, a spring form 910D is a single continuous sheet material or a single flat spring. The spring form 910D may be fabricated from the same materials described in reference to spring forms 710A.

FIGS. 9C and 9D are isometric views of one embodiment of a bracket 452 that includes one or more bases 705 that are integral to the bracket 452. In this embodiment, the bracket 452 is configured as an elongated bar that is coupled to the substrate support 104. The bracket 452 also includes empty bases 915 that may be used to couple additional compressible contact members 900, if desired, which enhances the modularity of the compressible contact members.

Figure 10A:
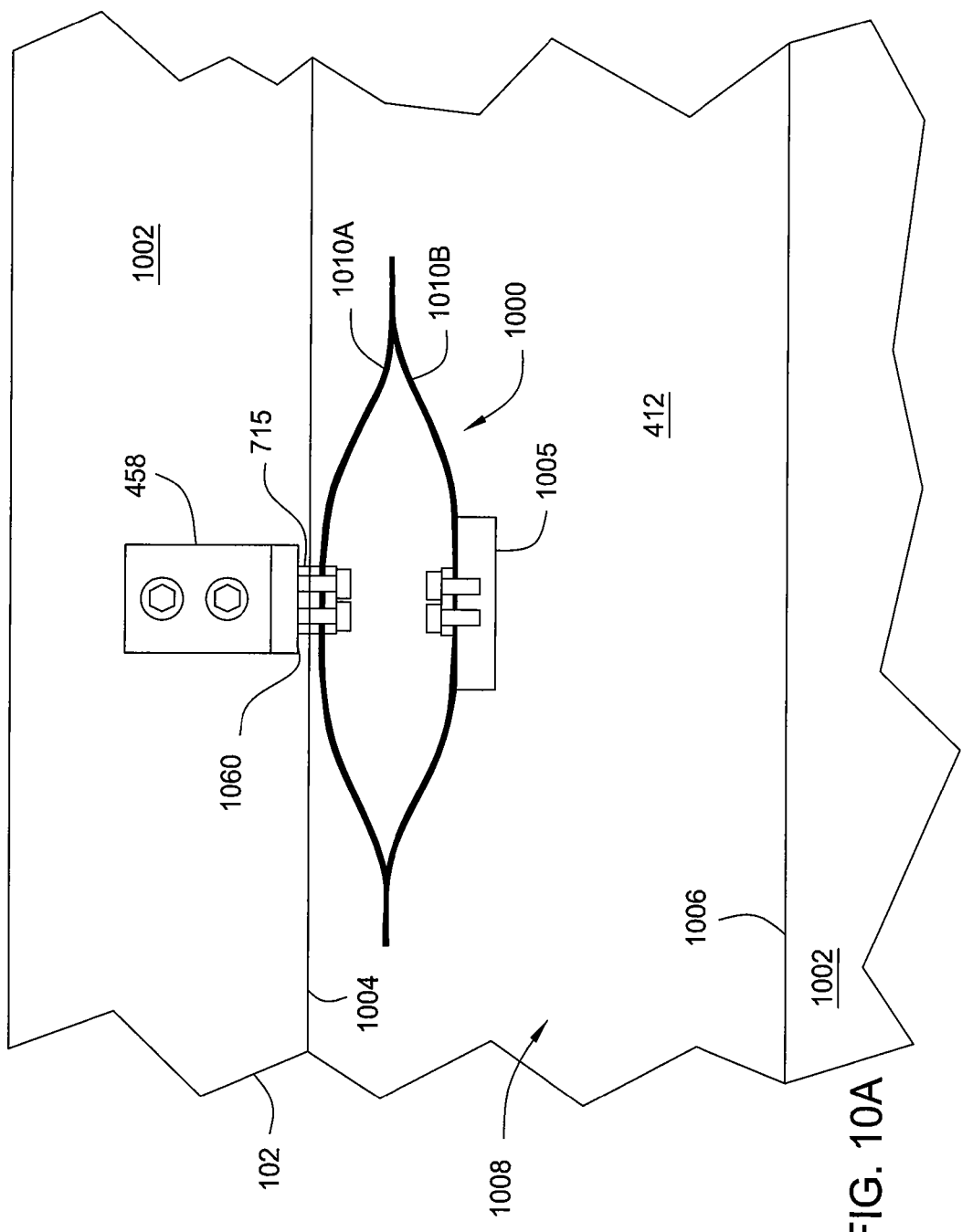
FIG. 10A is a schematic side view of another embodiment of a compressible contact member.

FIG. 10A is a schematic view of another embodiment of a compressible contact member 1000. In this embodiment, the compressible contact member 1000 is shown from an interior portion of the chamber body 102 adjacent the port 412. From the perspective in the interior of the chamber body 102, the port 412 includes a tunnel 1008 formed through a sidewall 1002 that is bounded by an upper portion 1004 and a lower portion 1006 of the tunnel 1008. The compressible contact member 1000 includes spring forms 1010A, 1010B coupled to a contact pad 715 and a base 1005. The spring forms 910A, 910B may be made from the same materials described in reference to spring forms 810A and 810B. The spring forms 1010A, 1010B may be made from the same materials described in reference to spring forms 710A.

The base 1005 is coupled to a bracket 452 and/or the substrate support 104, both of which are not shown in this view for clarity. In the raised position, the contact pad 715 is adapted to contact a contact surface 1060 of an extended member 458 that is fixedly coupled to the interior sidewall 1002 of the chamber body 102. As the compressible contact member 1000 is coupled to the substrate support and is shown in this view in a raised position, the substrate support would obscure the view of the compressible contact member 1000 and portions of the extended member 458. When the substrate support is lowered for a substrate transfer operation, the compressible contact member 1000 would move with the substrate support 104 such that no portion of the compressible contact member 1000 would interfere with the transfer operation at the port 412.

Figure 10B:
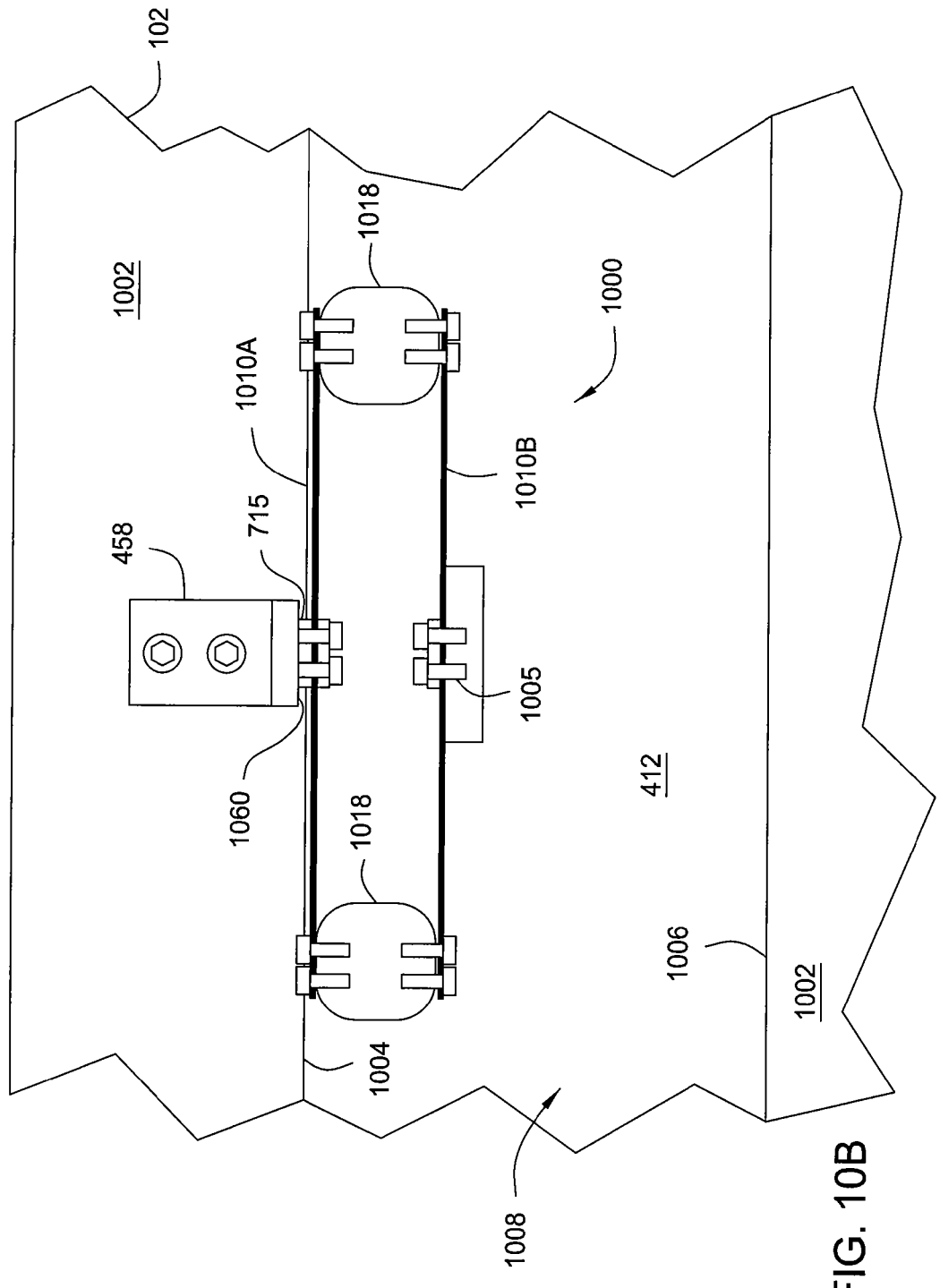
FIG. 10B is a schematic side view of another embodiment of a compressible contact member.

FIG. 10B is a schematic view of another embodiment of a compressible contact member 1000. The compressible contact member 1000 is shown from an interior portion of the chamber body 102 at the port 412 similar to the view of FIG. 10A. The compressible contact member 1000 includes spring forms 1010A, 1010B coupled to a contact pad 715 and a base 1005. The base 1005 is coupled to a bracket and/or a substrate support, both of which are not shown as the presence of the substrate support would obscure the view of the compressible contact member 1000. In this embodiment, the spring forms 1010A, 1010B are coupled to spacers 1018. The spring forms 1010A, 1010B and may be made from the same materials described in reference to spring forms 710A.

Figure 11B:
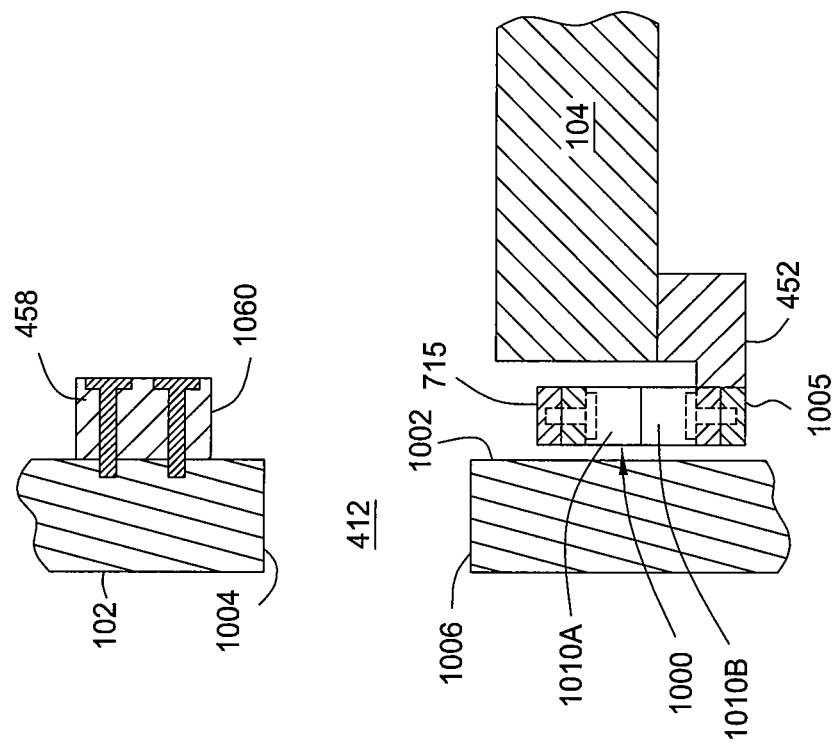

FIGS. 11A and 11B are side cross-sectional views of a portion of the chamber body 102 showing another embodiment of a compressible contact member 1000 of FIG. 10A coupled to a substrate support 104. FIG. 11A shows the compressible contact member 1000 and the substrate support 104 in a raised position and FIG. 11B shows the compressible contact member 1000 and the substrate support 104 in a lowered position. As described above, when the substrate support 104 is in a lowered position, no portion of the compressible contact member 1000 is in a position to interfere with the port 412.

FIG. 12A is an isometric side view of another embodiment of a compressible contact member 1200. The contact member 1200 includes a single spring form 1210. The single spring form 1210 may be in the form of a continuous flat piece of material and may comprise the same material as is described in reference to the spring form 710A. In this embodiment, the spring form 1210 comprises one or more bends 1215A-1215C adapted to increase compressive force of the spring form 1210. In this embodiment, each of the bends 1215A-1215C includes a corresponding bend on an opposite side of the spring form 1210 in a substantial mirror image. In one embodiment, the spring form 1210 shown in FIG. 12A comprises a shape similar to the omega symbol (Ω). It has been found that the omega-shaped spring form 1210 extends the life of the spring form 1210.

FIGS. 12B-12E are side views of various embodiments of the spring form 1210 that may be utilized with the contact member 1200 shown in FIG. 12A. Each of the spring forms 1210 may comprise the same material as is described in reference to the spring form 710A.

Figure 13A:
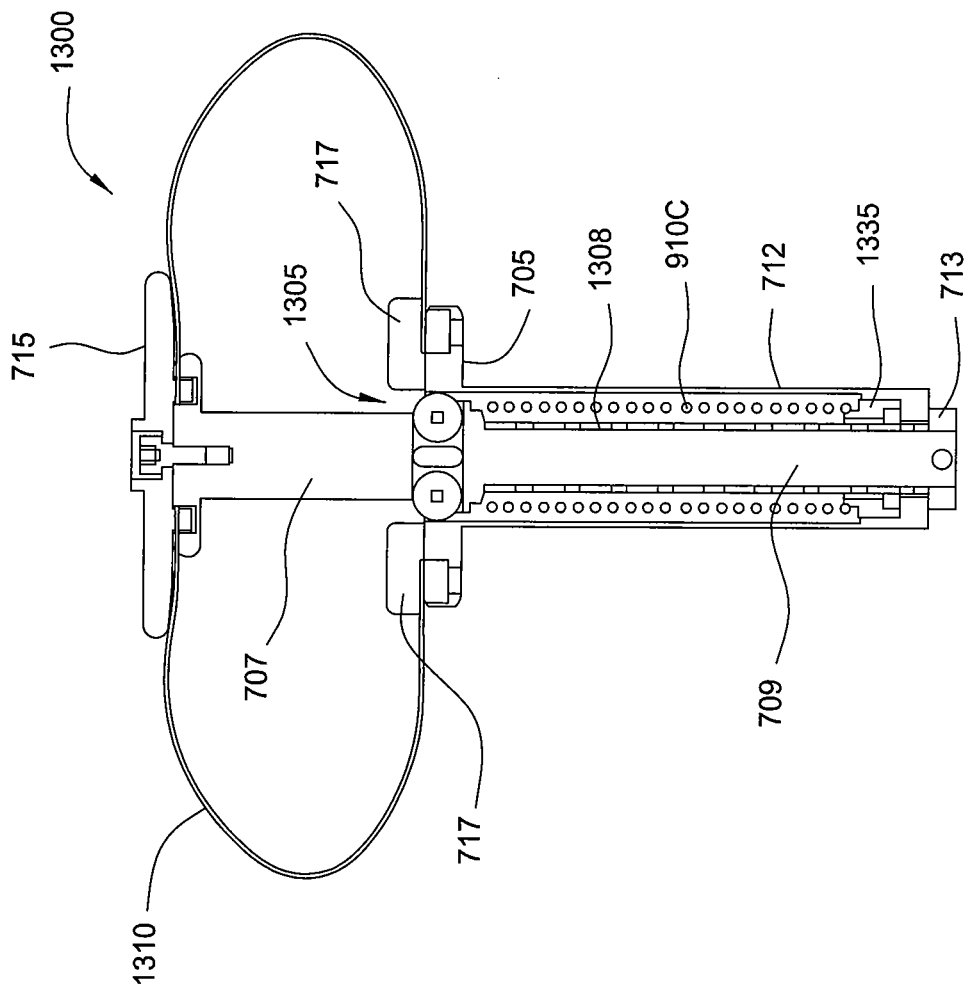
FIGS. 13A and 13B are cross-sectional views of another embodiment of a compressible contact member.
Figure 13B:
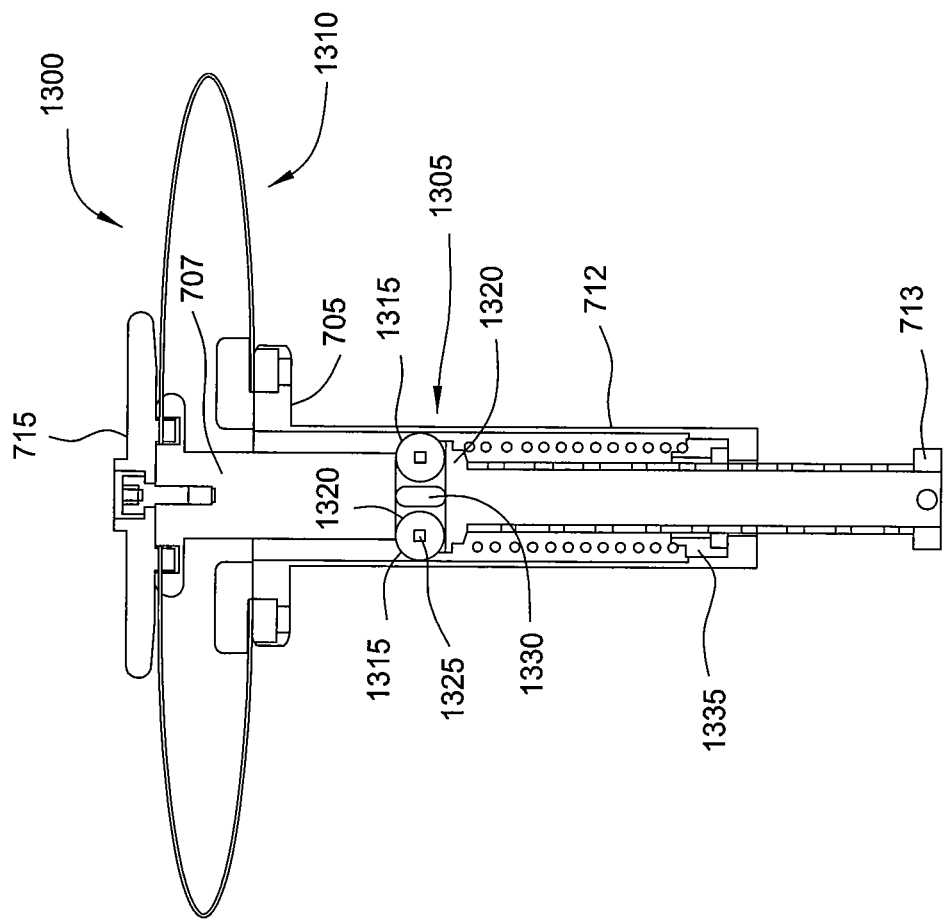

FIGS. 13A and 13B are cross-sectional views of another embodiment of a compressible contact member 1300. The contact member 1300 includes a spring form 1310 that may comprise the same material as is described in reference to the spring form 710A and any of the shapes shown in FIGS. 12A-12E. The contact member 1300 includes a spring form 910C and may be made of the same materials as the spring form 710B described in FIGS. 7A and 7B. The contact member 1300 includes a construction similar to the construction of the contact member shown in FIGS. 9A and 9B with the exception of a roller assembly 1305 and an inner tubular member 1308. The inner tubular member 1308 is adapted to receive the second shaft 709 as shown in FIG. 13C.

The roller assembly 1305 includes one or more rollers or bearings 1315 connected to a housing 1320 by a respective shaft 1325. Each of the bearings 1315 are adapted to be at least partially disposed in a cavity 1330 formed in the housing 1320. At least a portion of the bearings 1315 are adapted contact in inner surface of the tubular member 712 as the spring form 1310 is compressed or decompressed. The housing 1320 is configured as a stop for the spring form 910C and includes a lower housing 1335 adapted as a stop for the opposing side of the spring form 910C.

Figure 13C:
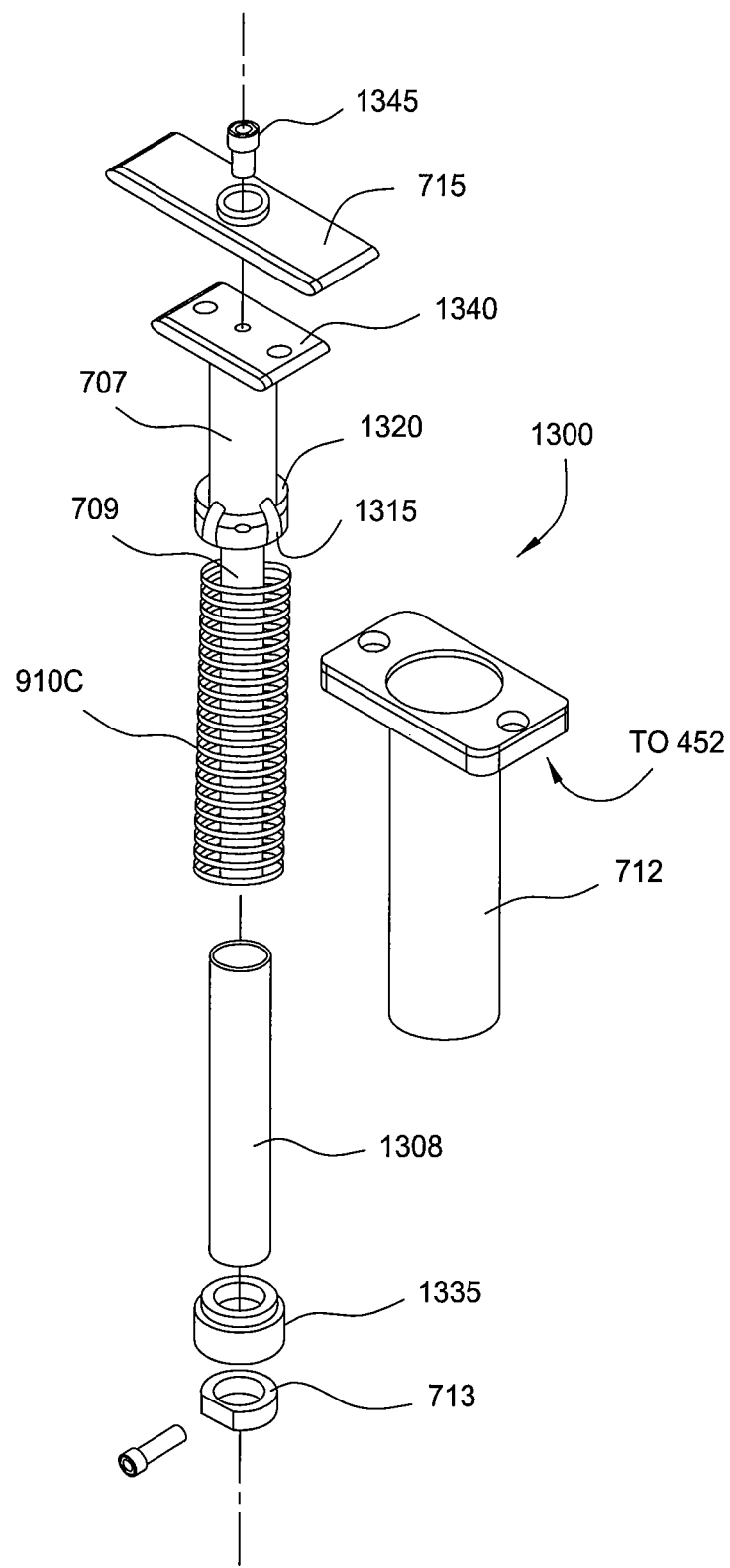
FIG. 13C is an exploded isometric view of the contact member shown in FIGS. 13A and 13B.

FIG. 13C is an exploded isometric view of the contact member 1300 shown in FIGS. 13A and 13B. The spring form 1310 is not shown in this view for clarity. In this embodiment, the contact pad 715 is made of aluminum and is coupled to a spring mount 1340 by a fastener 1345 made of aluminum. In one embodiment, the first shaft 707 and housing 1320 are unified into an integral part and is made of an aluminum or ceramic material. The bearings 1315 may be made of an aluminum or a ceramic material. The spring form 910C may be made of a HASTELLOY® material and is received in an inner diameter of the tubular member 712, which may be made of a ceramic or aluminum material. The inner tubular member 1308 is received between the inner diameter of the spring form 910C and the outer diameter of the second shaft 709. The inner tubular member 1308 may be made of a ceramic material and is adapted to reduce particle formation. For example, if the second shaft 709 and the inner tubular member 1308 are both made of a ceramic material, particle formation is reduced due to the interaction between the ceramic surfaces. Moreover, use of ceramic materials decreases galling as compared to aluminum components, which extends lifetime and reduces particle formation.

Figure 14A:
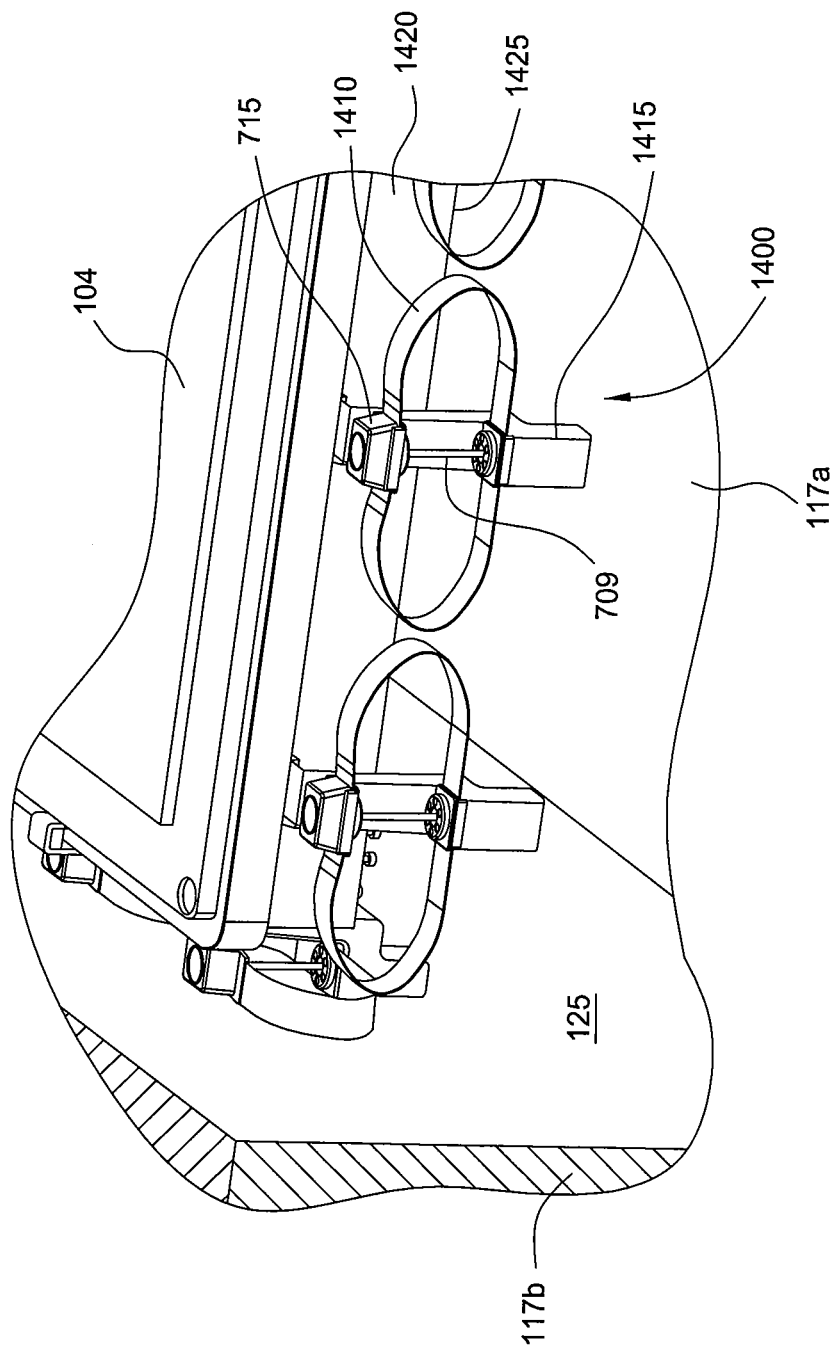
FIGS. 14A and 14B are isometric views of another embodiment of a compressible contact member.
Figure 14B:
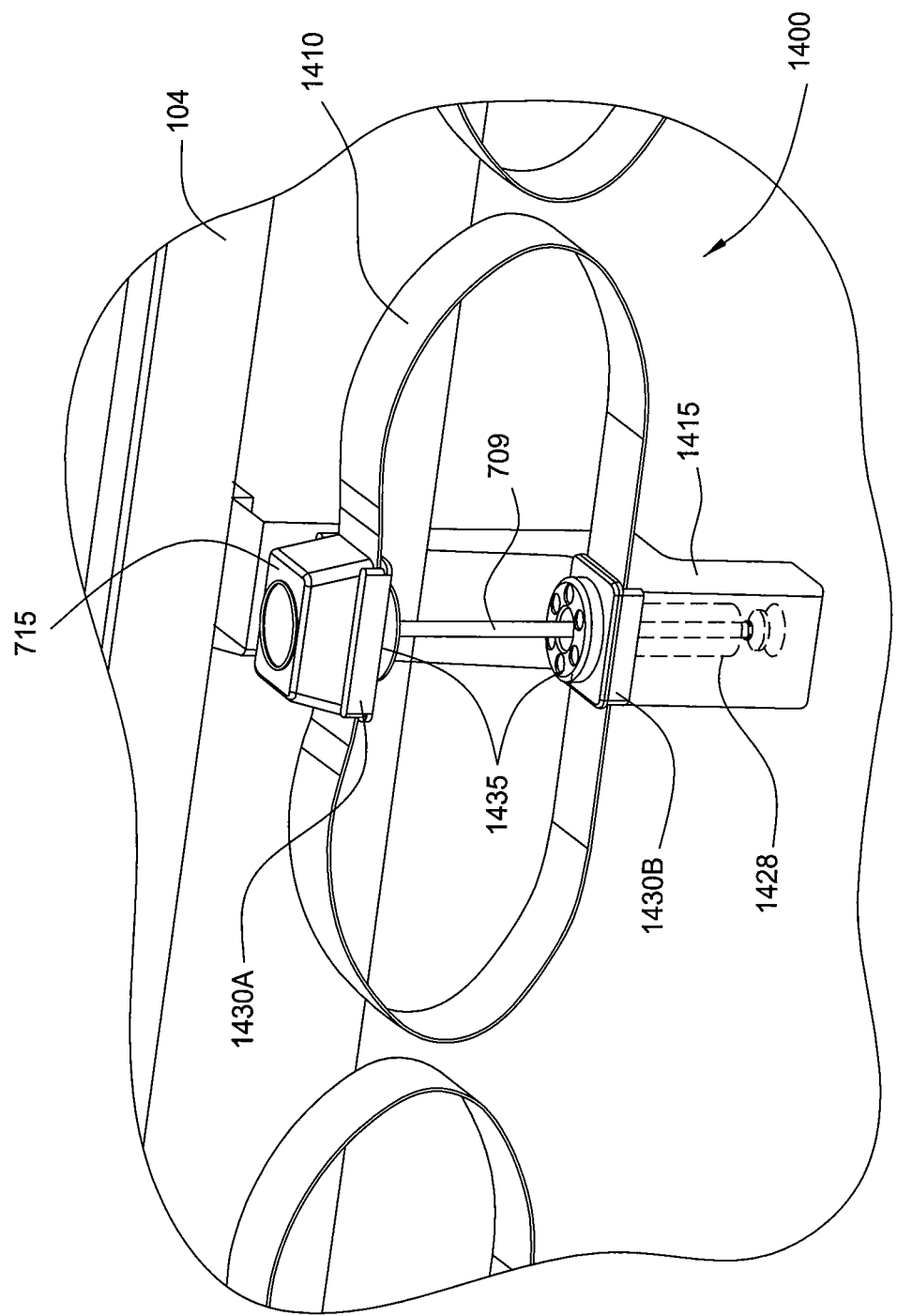
Figure 14C:
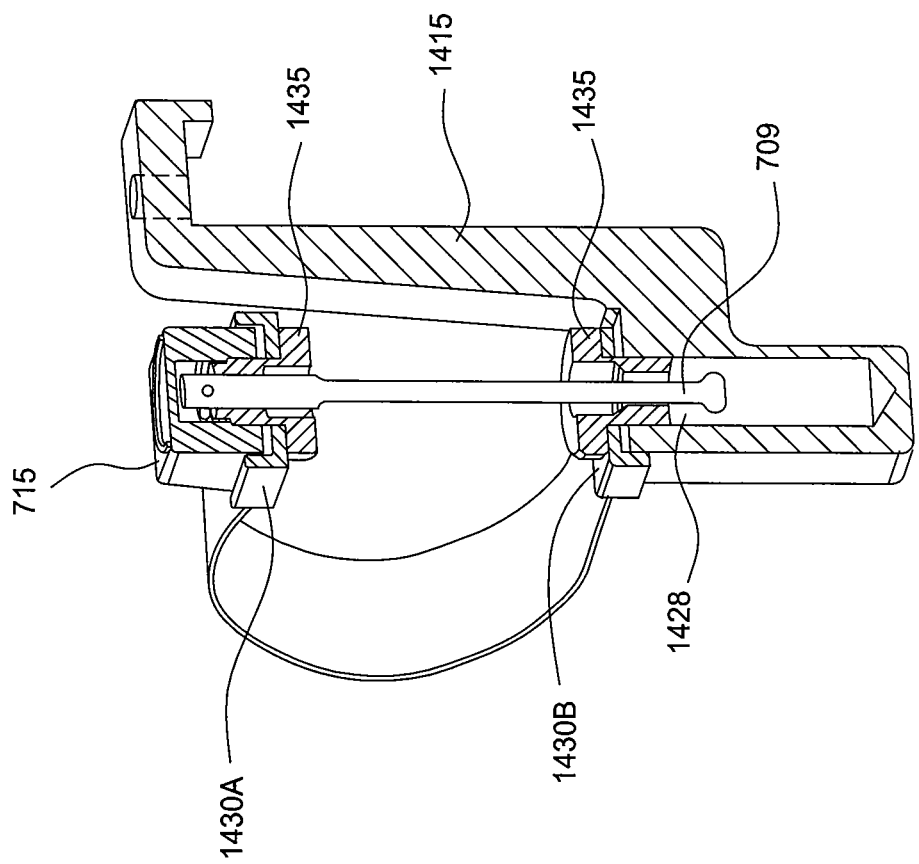
FIG. 14C is a side cross-sectional view of the contact member shown in FIGS. 14A and 14B.

FIGS. 14A and 14B are isometric views of another embodiment of a compressible contact member 1400 coupled to a substrate support 104. FIG. 14C is a side cross-sectional view of the contact member 1400 shown in FIGS. 14A and 14B. The contact member 1400 includes a spring form 1410 configured to provide flexibility for the contact member 1400 without the use of a compression spring as shown in FIGS. 7A and 13A. The spring form 1410 may comprise the same material as is described in reference to the spring form 710A.

The contact member 1400 includes a bracket 1415 adapted to hang and/or fasten to a side 1420 and/or a bottom 1425 of the substrate support 104. The contact member 1400 includes the second shaft 709 that is at least partially received by an opening 1428 formed in the bracket 1415. The second shaft 709 and the configuration of the bracket 1415 prevents the spring form 1410 from fully extending or decompressing and also preloads the spring form 1410. The contact member 1400 includes clamps 1430A, 1430B adapted to couple to the spring form 1410. The contact member 1400 also includes one or more bushings 1435 that may be configured as a guide for the second shaft 709. The bracket 1415 and the clamps 1430A, 1430B may be made of aluminum while the second shaft 709 and the bushings 1435 may be made from a ceramic material.

Figure 14F:
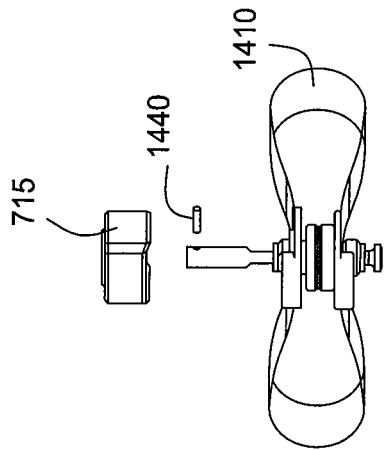
FIGS. 14E and 14F are isometric views of the contact member shown in FIGS. 14A and 14B illustrating installment of a spring form.
Figure 14E:
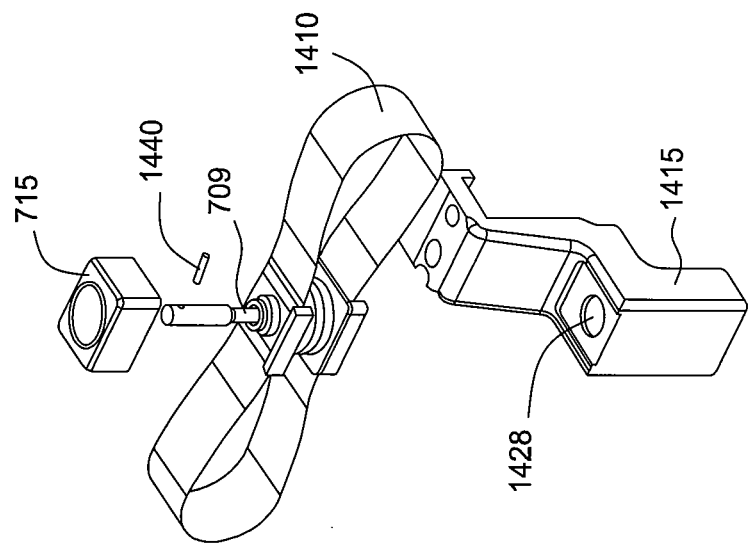
Figure 14D:
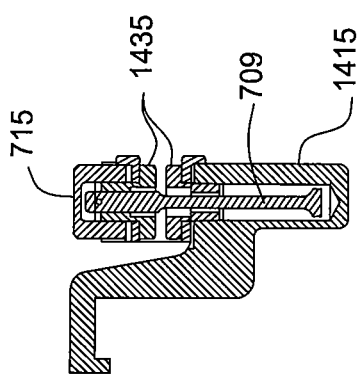
FIG. 14D is a side cross-sectional view of the spring form of the contact member shown in FIGS. 14A and 14B in a partially compressed position.

FIG. 14D is a side cross-sectional view of the spring form 1410 of the contact member 1400 shown in FIGS. 14A and 14B in a compressed position. FIGS. 14E and 14F are isometric views of the contact member 1400 shown in FIGS. 14A and 14B illustrating the installment or removal of a spring form 1410. In one embodiment, the spring form 1410 is depressed and the second shaft 709 is removed from the bracket 1415. A fastener 1440, such a s screw or pin may be adapted as a keeper and inserted into an upper portion of the second shaft 709 in order to hold the spring form 1410 onto the second shaft 709.

FIG. 14G is a side cross-sectional view of a contact member 1400 as described in FIGS. 14A and 14B coupled to a substrate support 104 in a raised position. The contact pad 715 is shown contacting an extended member 458 disposed on the inner surface of a sidewall 117b above a transfer port 412. As the substrate support is lowered, the contact member 1400 moves with the substrate support and the area interior of the transfer port 412 is clear for substrate transfer.

Figure 15:
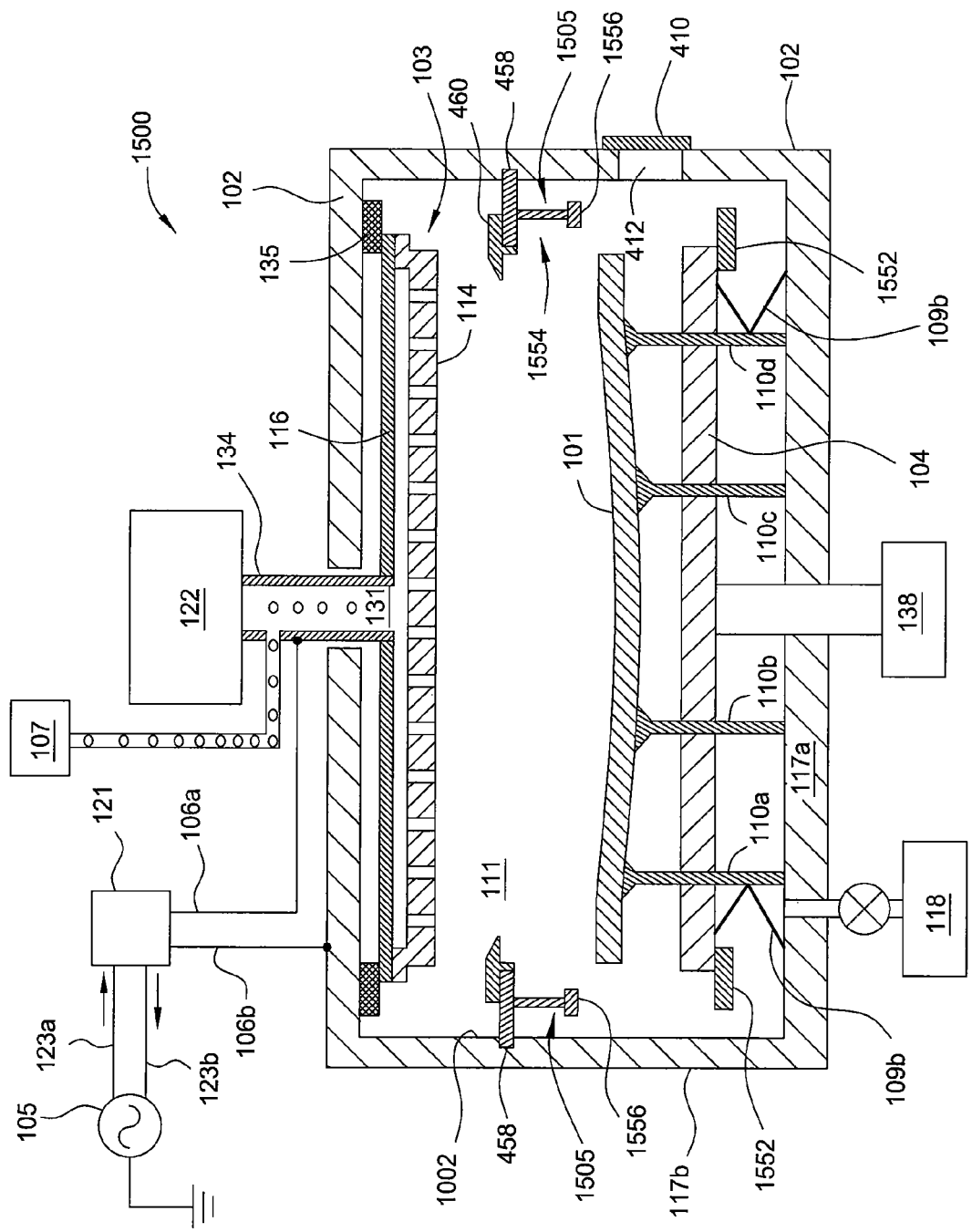
FIG. 15 is a schematic cross sectional view of another embodiment of a plasma processing system.

FIG. 15 is a schematic cross sectional view of another embodiment of a plasma processing system 1500. The processing system 1500 is substantially similar to the processing systems 100 and 400 described in FIGS. 1 and 4 with the exception of a plurality of compressible contact members 1505 coupled to an interior sidewall 1002 of the chamber body 102. The compressible contact members 1505 may be configured similarly to the compressible contact members 415, 900, 1000, 1200, 1300 or 1400 as described above. In this embodiment, each of the compressible contact members 1505 include a contact portion 1556 and an elastic portion 1554, which are substantially similar to embodiments of the elastic portion 454 and contact portion 456 described above. The compressible contact members 1505 are coupled to extended members 458 disposed on the interior of the chamber body 102. In embodiments where a shadow frame 460 may be used, the shadow frame 460 may rest on the extended members 458. Holes or slots may be provided in the perimeter of the shadow frame 460 to allow clearance for any movable portions of the compressible contact members 1505.

In this embodiment, the contact portion 1556 is adapted to contact a bracket 1552 disposed on the substrate support 104 when the substrate support 104 is in a raised position. In one aspect, the temperature of the chamber body 102 may be cooler than the temperature of the substrate support 104. Thus, coupling of the compressible contact members 1505 to the chamber body 102 exposes the compressible contact members 1505 to a lower temperature as opposed to the temperatures the compressible contact member would experience when coupled to the substrate support 104. The lower temperature of the compressible contact members 1505 may increase the lifetime of the compressible contact members 1505.

The embodiments of the RF devices 109a and 109b described herein provide a superior alternative to the conventional ground/return schemes by allowing RF return in varied positional levels of a substrate support 104. Typically, conventional PECVD substrate supports are grounded solely by ground straps which connect to the chamber floor. This ground method utilizes straps that are very long, which may pose great resistance to the returning RF current, thereby allowing high electrical potentials to be generated between the sidewalls of a chamber and the substrate support. The higher electrical potentials may lead to arcing between the sidewalls of the chamber and the substrate support Further, ground straps adjacent the sidewall of the chamber having a transfer port may be in the way during substrate transfer processes. The existence of the transfer port 412 in one of the sidewalls of the chamber creates a greater asymmetry in the RF return path. Embodiments of the RF devices 109a and compressible contact members as described herein allow the susceptor to be grounded to the chamber above the slit valve opening, which shortens the ground path and may be adapted to facilitate a similar or symmetrical ground path on all sides of the chamber. Embodiments of the RF devices 109*a*, 109*b* and the compressible contact members as described herein also allow adjustability in the height of the substrate support while maintaining ground potential, which allows the substrate support to be grounded over a greater range of spacing distances for deposition, post- or pre-deposition, and cleaning processes.

Embodiments of the compressible contact members as described herein allow the substrate support to be grounded to the chamber wall above the slit valve opening. Embodiments of the compressible contact members as described herein creates individual ground contact units which mount to the substrate support and or chamber sidewall. In one embodiment, as the substrate support moves up, the compressible contact members engage on fixed grounded surfaces of the chamber above the slit valve opening. The compressible contact member units contain a compliant component which allows the substrate support to maintain a ground contact over a range of process spacing distances. When the substrate support is lowered, the grounding contact units disengage from the grounded contact pads. Embodiments of the compressible contact members as described herein allows the susceptor to be grounded to the chamber body above the slit valve opening eliminating the slit valve opening affecting the RF return path. Embodiments of the RF devices 109*a* allows the RF devices 109*b* to be much shorter. Also, since the ground contact units are each mounted to the substrate support independently and since they have a compliant component they do not rely on surfaces being flat to achieve good electrical contacts.

While the foregoing is directed to embodiments of the present invention, other and further embodiments of the invention may be devised without departing from the basic scope thereof, and the scope thereof is determined by the claims that follow.

What is claimed is:

1. A radio frequency return device for a plasma processing chamber, comprising: a base having a shaft movably disposed within an opening formed in the base; a first spring form comprising a compression spring disposed about the shaft on one side of the base, wherein the shaft comprises a removable collar that retains the first spring form on an end of the shaft opposite the base; a tubular member extending between the base and the removable collar, wherein the shaft and the first spring form are disposed within the tubular member; a second spring form comprising a strap coupled
   between the base and an opposite end of the shaft on an opposing side of the base relative to the first spring form, the second spring form extending from the opposite end of the shaft to the base on opposing sides of the shaft and comprising: a first material made of a metal or metal alloy having an elastic property that is substantially the same at an ambient temperature and a processing temperature of about 200 C or greater; and a second material substantially encasing the first material, the second material being different than the first material; and a contact pad coupled to the second spring form.

2. The device of claim 1, wherein the second material is conductive and the first material is coated, wrapped or clad with the second material.

3. The device of claim 2, wherein the second material includes a first property at ambient temperature and a second property at the processing temperature, the first property and the second property being substantially different.

4. The device of claim 2, wherein the coating, wrapping or cladding comprises an aluminum material.

5. The device of claim 4, wherein the aluminum material comprises a foil material.

6. The device of claim 1, wherein the first material retains about 85% of the elastic property at the processing temperature.

7. The device of claim 1, wherein the elastic property is ultimate tensile strength.

8. The device of claim 1, wherein the first material comprises a nickel-molybdenum-chromium alloy.

9. The device of claim 8, wherein the second material comprises an aluminum material.

10. The device of claim 1, wherein the second spring form is coupled to the opposing end of the shaft.

11. A plasma processing system, comprising:
    a chamber; and
    a first electrode disposed within the chamber, the first electrode facilitating generation of a plasma within the chamber and movable relative to a second electrode within the chamber, the first electrode comprising one or more contact members, at least one of the one or more contact members comprising:
    a base coupled to the first electrode, the base having a shaft movably disposed within an opening formed in the base;
    a first spring form coupled to a first side of the base, between the base and a first end of the shaft, wherein the shaft comprises a removable collar that retains the first spring form on the first end of the shaft opposing opposite the first side of the base;
    a tubular member extending between the base and the removable collar, wherein the shaft and the first spring form are disposed within the tubular member; and
    a second spring form comprising a metal or a metal alloy coupled between a second end of the shaft and the base on opposing sides of the shaft.

12. The system of claim 11, wherein the metal or metal alloy is coated, wrapped or clad with a conductive material.

13. The system of claim 12, wherein the coating, wrapping or cladding comprises aluminum.

14. The system of claim 11, wherein the metal or metal alloy substantially retains elasticity without plastically deforming when the metal or metal alloy reaches a temperature above about 200 C.

15. The system of claim 14, wherein the first spring form comprises a compression spring.

16. The system of claim 11, wherein the second spring form comprises:
    a first material made of the metal or metal alloy having a mechanical property that is substantially the same at an ambient temperature and a processing temperature of about 200° C. or greater.

17. The system of claim 16, wherein the first material is coated, wrapped or clad with a second material that is different than the first material.

18. The system of claim 17, wherein the second material includes a first property at ambient temperature and a second property at the processing temperature, the first property and the second property being substantially different.

19. The system of claim 11, wherein the chamber includes at least four sidewalls and a bottom, at least one of the sidewalls including a transfer port, and wherein
    a plurality of flexible straps are disposed between the first electrode and the bottom.

20. The system of claim 19, wherein the one or more contact members are disposed on a side of the first electrode facing the transfer port.

21. The system of claim 11, wherein the first spring form is coupled to the first end of the shaft.

22. A plasma processing system, comprising: a chamber comprising a bottom and at least four sidewalls; a first electrode disposed within the chamber, the first electrode being movable relative to a second electrode within the chamber; and a plurality of radio frequency return devices disposed between the first electrode and at least one of the at least four sidewalls, wherein each of the plurality of radio frequency return devices comprise: a base having a shaft movably disposed within an opening formed in the base; a first spring form comprising a compression spring coupled to one side of the base, wherein the shaft comprises a removable collar that retains the first spring form on an end of
the shaft opposite the base; a tubular member extending between the base and the removable collar, wherein the shaft and the first spring form are disposed within the tubular member; a second spring form coupled between the base and an opposite end of the shaft opposing the side of the base having the first spring form and on opposing sides of the shaft, the second spring form comprising a first material made of a metal or metal alloy having an elastic property that is substantially the same at an ambient temperature and a processing temperature of about 200 C or greater; and a second material substantially encasing the first material, the second material being different than the first material.

23. The system of claim 22, wherein the chamber further includes a transfer port formed in one of the at least four sidewalls, and the plurality of radio frequency return devices are disposed on a side of the first electrode facing the transfer port.

24. The system of claim 22, wherein the second material is conductive and the first material is coated, wrapped or clad with the second material.

25. The system of claim 24, wherein the coating, wrapping or cladding comprises an aluminum material.

26. The system of claim 25, wherein the aluminum material comprises a foil material.

27. The system of claim 22, wherein the first material retains about 85% of the elastic property at the processing temperature.

28. The system of claim 22, wherein the first material comprises a nickel-molybdenum-chromium alloy.

29. The system of claim 28, wherein the second material comprises an aluminum material.

30. A radio frequency return device for a plasma processing chamber, comprising: a base; a shaft movably disposed within an opening formed in the base; a compression spring coupled about the shaft on a first side of the base, wherein the shaft comprises a removable collar that retains the compression spring on an end of the shaft opposite the base; a tubular member extending between the base and the removable collar, wherein the shaft and the compression spring are disposed within the tubular member; a strap coupled to an opposing end of the shaft on a second side of the base opposing the first side and extending between the base and the shaft on
opposing sides of the shaft, the strap comprising: a first material made of a metal or metal alloy having an elastic property that is substantially the same at an ambient temperature and a processing temperature of about 200 C or greater; and a second material substantially encasing the first material, the second material being different than the first material; and a contact pad coupled to the strap.

31. The device of claim 30, wherein the second material is conductive and the first material is coated, wrapped or clad with the second material.

32. The device of claim 31, wherein the coating, wrapping or cladding comprises an aluminum material.

33. The device of claim 30, wherein the first material comprises a nickel-molybdenum-chromium alloy.

* * * * *